(12) United States Patent
Sung et al.

(10) Patent No.: US 10,985,106 B2
(45) Date of Patent: Apr. 20, 2021

(54) STACK PACKAGES INCLUDING BRIDGE DIES

(71) Applicant: SK hynix Inc., Icheon-si (KR)

(72) Inventors: Ki Jun Sung, Cheongju-si (KR); Ha Gyeong Song, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 234 days.

(21) Appl. No.: 16/216,778

(22) Filed: Dec. 11, 2018

(65) Prior Publication Data

US 2020/0075490 A1    Mar. 5, 2020

(30) Foreign Application Priority Data

Aug. 31, 2018   (KR) .......................... 10-2018-0103180

(51) Int. Cl.
| | |
|---|---|
| *H01L 23/538* | (2006.01) |
| *H01L 25/065* | (2006.01) |
| *H01L 23/00* | (2006.01) |
| *H01L 23/29* | (2006.01) |
| *H01L 23/31* | (2006.01) |

(52) U.S. Cl.
CPC .......... *H01L 23/5381* (2013.01); *H01L 23/29* (2013.01); *H01L 23/3114* (2013.01); *H01L 23/5384* (2013.01); *H01L 24/09* (2013.01); *H01L 24/17* (2013.01); *H01L 24/73* (2013.01); *H01L 25/0657* (2013.01); *H01L 2224/02373* (2013.01)

(58) Field of Classification Search
CPC ... H01L 23/5381; H01L 23/29; H01L 23/3114
See application file for complete search history.

(56) References Cited

U.S. PATENT DOCUMENTS

2016/0225744 A1*   8/2016   Nam ................... H01L 25/0657

FOREIGN PATENT DOCUMENTS

| KR | 101236798 B1 | 2/2013 |
|---|---|---|
| KR | 1020150009881 A | 1/2015 |

* cited by examiner

*Primary Examiner* — Lex H Malsawma
*Assistant Examiner* — Xia L Cross
(74) *Attorney, Agent, or Firm* — William Park & Associates Ltd.

(57) ABSTRACT

A stack package includes a plurality of sub-packages vertically stacked. Each of the sub-packages includes a bridge die having a plurality of vertical interconnectors and a semiconductor die. A first group of vertical interconnectors disposed in a first bridge die included in a first sub-package of the sub-packages and other vertical interconnectors connected to the first group of vertical interconnectors constitute a first electric path, and a second group of vertical interconnectors disposed in a second bridge die included in a second sub-package of the sub-packages and other vertical interconnectors connected to the second group of vertical interconnectors constitute a second electric path. The first and second electric paths are electrically isolated from each other and disposed to provide two separate electric paths.

19 Claims, 15 Drawing Sheets

STACK PACKAGES INCLUDING BRIDGE DIES

CROSS-REFERENCE TO RELATED APPLICATIONS

The present application claims priority under 35 U.S.C 119(a) to Korean Application No. 10-2018-0103180, filed on Aug. 31, 2018, which is incorporated herein by references in its entirety.

BACKGROUND

1. Technical Field

The present disclosure generally relates to semiconductor package technologies and, more particularly, to stack packages including a semiconductor die and a bridge die.

2. Related Art

Recently, semiconductor packages having a high density and operating at a high speed have been required in various electronic systems. In addition, the semiconductor packages have been developed to have a structure of a relatively small form factor. In order to realize such semiconductor packages, a lot of effort has been focused on a chip stack technology. Moreover, in order to realize the semiconductor packages having a reduced thickness, a lot of effort has been focused on a wafer level chip stack package technology.

SUMMARY

According to an embodiment, a stack package includes first to fourth sub-packages. The first sub-package includes a first left bridge die, a first semiconductor die and a first right bridge die which are spaced apart from each other. The second sub-package is stacked on the first sub-package to include a second left bridge die, a second semiconductor die and a second right bridge die which are spaced apart from each other. The third sub-package is stacked on the second sub-package to include a third left bridge die, a third semiconductor die and a third right bridge die which are spaced apart from each other. The fourth sub-package is stacked on the third sub-package to include a fourth left bridge die, a fourth semiconductor die and a fourth right bridge die which are spaced apart from each other. The first to fourth left bridge dies includes a first left vertical interconnector for connection and a first left vertical interconnector for bypass, a second left vertical interconnector for connection and a second left vertical interconnector for bypass, a third left vertical interconnector for connection and a third left vertical interconnector for bypass, and a fourth left vertical interconnector for connection and a fourth left vertical interconnector for bypass, respectively. The first to fourth right bridge dies includes a first right vertical interconnector for connection and a first right vertical interconnector for bypass, a second right vertical interconnector for connection and a second right vertical interconnector for bypass, a third right vertical interconnector for connection and a third right vertical interconnector for bypass, and a fourth right vertical interconnector for connection and a fourth right vertical interconnector for bypass, respectively. The fourth sub-package further includes a fourth left redistributed line electrically connecting the fourth left vertical interconnector for connection to the fourth semiconductor die. The third left vertical interconnector for bypass, the second left vertical interconnector for bypass and the first left vertical interconnector for bypass are vertically connected in series to the fourth left vertical interconnector for connection. The fourth left vertical interconnector for connection and the first to third left vertical interconnectors for bypass are disposed to electrically bypass the first to third semiconductor dies.

According to an embodiment, a stack package includes a plurality of sub-packages. Each of the sub-packages includes a bridge die including a plurality of vertical interconnectors and a semiconductor die disposed to be spaced apart from the bridge die. The plurality of sub-packages are vertically stacked to provide a plurality of electric paths comprised of the plurality of vertical interconnectors which are vertically stacked. A first sub-package of the plurality of sub-packages further includes a first redistributed line that electrically connects a first semiconductor die corresponding to the semiconductor die included to the first sub-package with first vertical interconnectors corresponding to the vertical interconnectors disposed in a first bridge die corresponding to the bridge die included in the first sub-package. A second sub-package of the plurality of sub-packages further includes a second redistributed line that electrically connects a second semiconductor die corresponding to the semiconductor die included to the second sub-package with second vertical interconnectors corresponding to the vertical interconnectors disposed in a second bridge die corresponding to the bridge die included in the second sub-package. A first electric path and a second electric path of the electric paths are electrically isolated from each other to provide two separate electric paths. The first electric path includes a first group of vertical interconnectors, which are vertically connected to the first vertical interconnectors, among the vertical interconnectors. The second electric path includes a second group of vertical interconnectors, which are vertically connected to the second vertical interconnectors, among the vertical interconnectors.

According to an embodiment, a stack package includes a bridge die disposed on a redistribution structure, wherein the bridge die comprises a first set of vertical interconnectors; and a semiconductor die disposed on the redistribution structure, wherein the semiconductor die is spaced apart from the bridge die. The plurality of sub-packages may be vertically stacked to provide a plurality of electrical pathways, wherein each electrical pathway comprises a second set of vertically stacked interconnectors. For each sub-package, the redistribution structure may provide an electrical pathway from the first set of vertical interconnectors to the semiconductor die.

DETAILED DESCRIPTION

Figure 1:
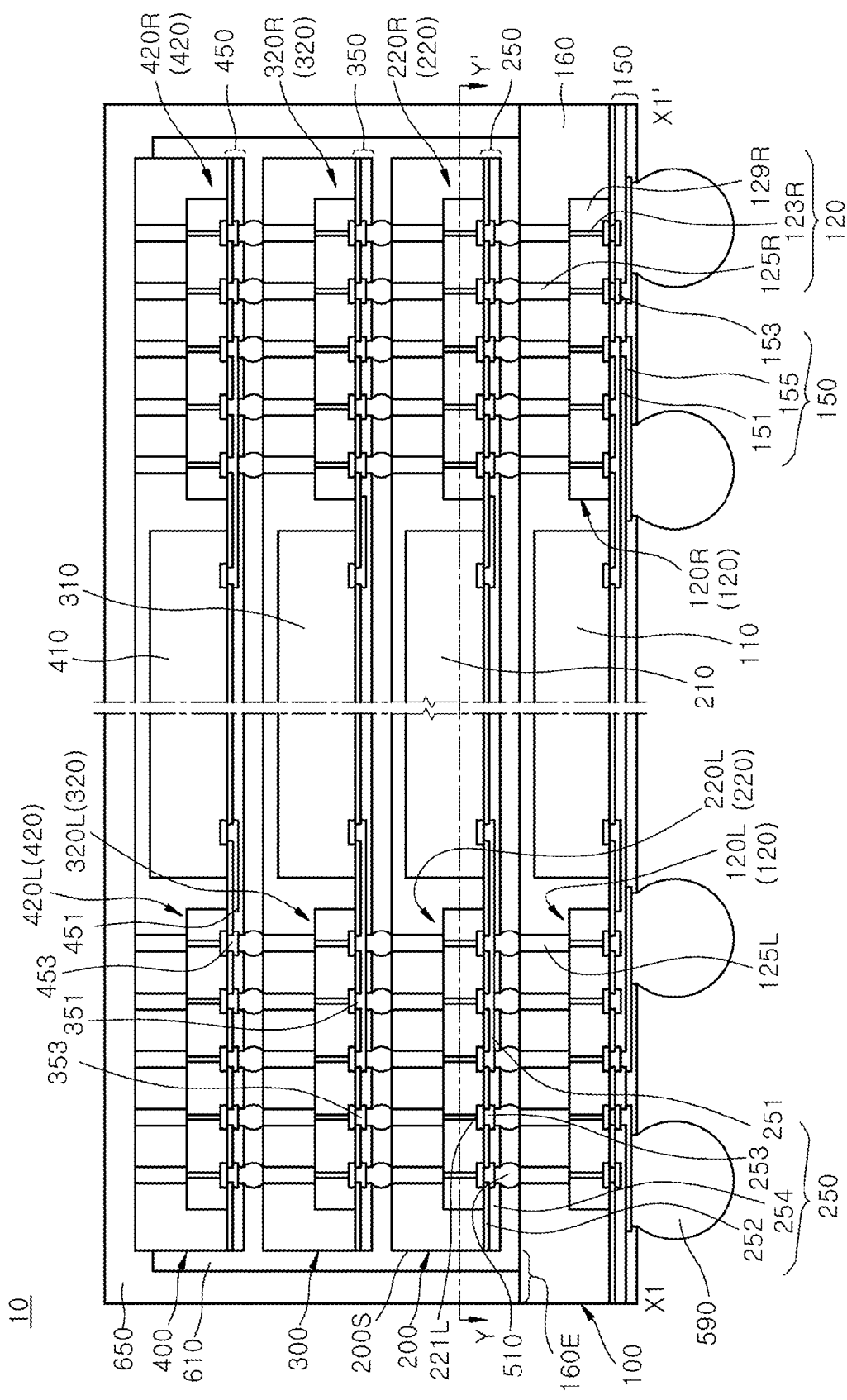
FIGS. 1 and 2 illustrate a stack package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
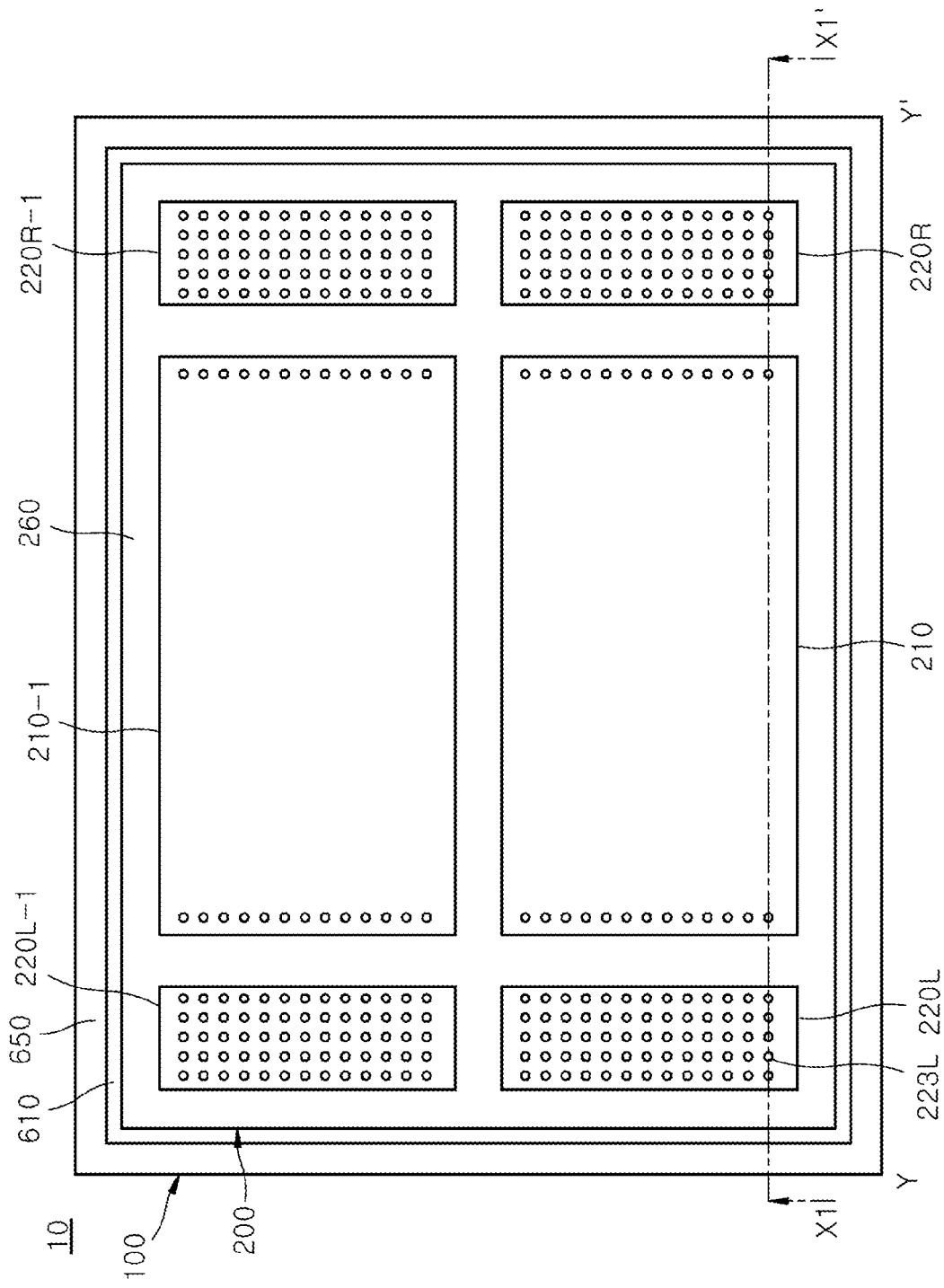
Figure 3:
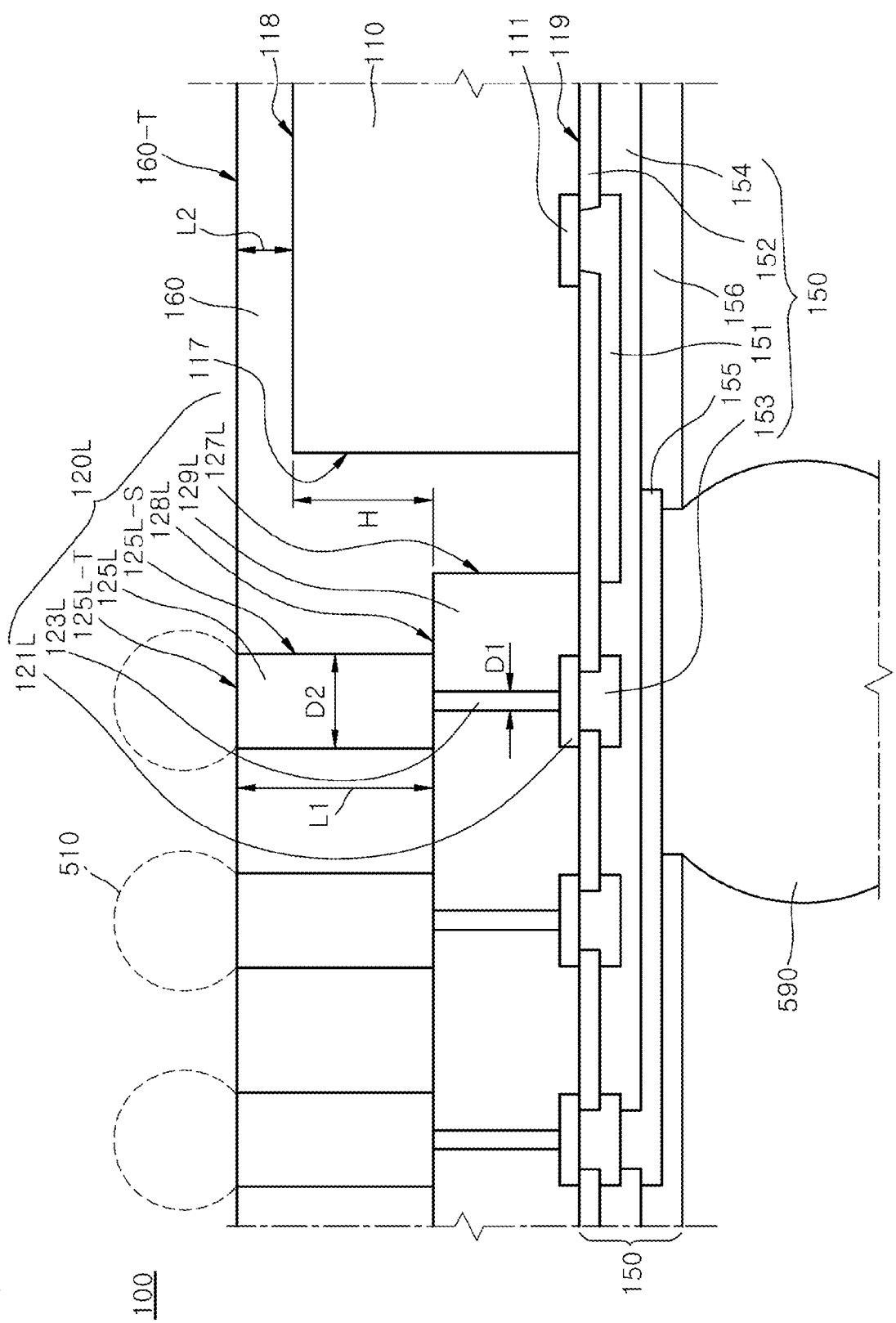
FIG. 3 is an enlarged view illustrating a first sub-package included in the stack package of FIG. 1.
Figure 4:
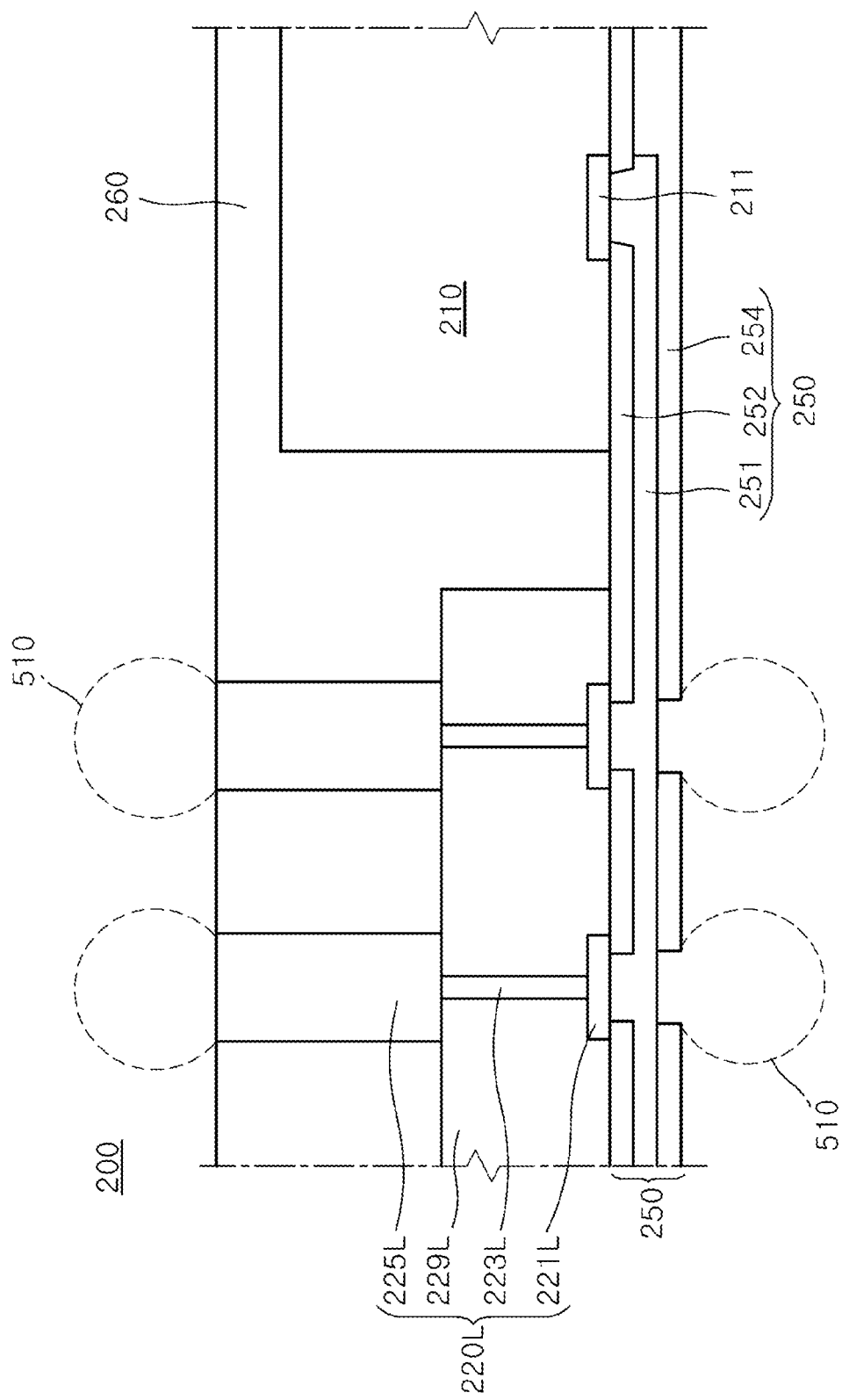
FIG. 4 is an enlarged view illustrating a second sub-package included in the stack package of FIG. 1.

FIGS. 1 and 2 illustrate a stack package 10 according to an embodiment. FIG. 2 is a plan view taken along a line Y-Y' of FIG. 1. FIG. 1 is a cross-sectional view taken along a line X1-X1' of FIG. 2. FIG. 3 is an enlarged view illustrating a portion of a first sub-package 100 included in the stack package 10 of FIG. 1. FIG. 4 is an enlarged view illustrating a second sub-package 200 included in the stack package 10 of FIG. 1.

Referring to FIG. 1, the stack package 10 may be configured to include a plurality of sub-packages, for example, the first sub-package 100, the second sub-package 200, a third sub-package 300 and a fourth sub-package 400 which are sequentially stacked. The stack package 10 may have a structure that four sub-packages of the first to fourth sub-packages 100, 200, 300 and 400 are vertically stacked. In other embodiments, the number of the sub-packages vertically stacked may be less or greater than four.

The second sub-package 200 may be vertically stacked on the first sub-package 100. The third and fourth sub-packages 300 and 400 may be sequentially stacked on a surface of the second sub-package 200 opposite to the first sub-package 100. Inner connectors 510 may be disposed between the first to fourth sub-packages 100, 200, 300 and 400. The inner connectors 510 may be connection members that electrically or physically connect the first to fourth sub-packages 100, 200, 300 and 400 to each other. The inner connectors 510 may be realized using solder balls or conductive bumps.

Outer connectors 590 may be electrically connected to the first sub-package 100. The outer connectors 590 may act as connection members that electrically connect the stack package 10 to an external system or another electronic module. The outer connectors 590 may be realized using solder balls. Since the outer connectors 590 are directly attached to the first sub-package 100, the stack package 10 may be realized even without using any package substrate such as a printed circuit board (PCB). This may lead to reduction of a thickness of the stack package 10.

The stack package 10 may further include a filling layer 610 that fills gaps between the first to fourth sub-packages 100, 200, 300 and 400. The filling layer 610 may include a dielectric material for electrical insulating the first to fourth sub-packages 100, 200, 300 and 400 from each other. For example, the filling layer 610 may include a dielectric material which is known as an underfill material. The filling layer 610 may extend to cover side surfaces of the second, third and fourth sub-packages 200, 300 and 400.

The stack package 10 may further include an outer molding layer 650 that covers and protects the second, third and fourth sub-packages 200, 300 and 400. The outer molding layer 650 may be an encapsulation layer that covers a portion of the first sub-package 100 and entire portions of the second, third and fourth sub-packages 200 300 and 400. The outer molding layer 650 may be formed on the first sub-package 100 with a molding process using an encapsulant material such as an epoxy molding compound (EMC) material. The first sub-package 100 may act as a base structure during the molding process.

Although FIG. 1 illustrates an example in which the outer molding layer 650 is distinct from the filling layer 610, the outer molding layer 650 and the filling layer 610 may be simultaneously formed using a molded underfill layer in some embodiments.

Referring to FIGS. 1 and 3, the first sub-package 100 may be provided as a single package unit disposed at a relatively low portion in the stack package 10. The first sub-package 100 may be configured to include a first semiconductor die 110 and a first inner molding layer 160 covering and protecting the first semiconductor die 110. The first semiconductor die 110 may be disposed on a first redistribution structure 150. A first left bridge die 120L and a first right bridge die 120R may be located at both sides of the first semiconductor die 110, respectively. The first left bridge die 120L and the first right bridge die 120R may be disposed on the first redistribution structure 150 to be spaced apart from a left side surface and a right side surface of the first semiconductor die 110, respectively. The first inner molding layer 160 may be formed to fill gaps between the first semiconductor die 110, the first left bridge die 120L and the first right bridge die 120R and may extend to cover the first semiconductor die 110, the first left bridge die 120L and the first right bridge die 120R.

Referring to FIG. 3, the first semiconductor die 110 may be disposed on the first redistribution structure 150 in a face-down shape such that a first surface 119 of the first semiconductor die 110 faces the first redistribution structure 150. As illustrated in FIG. 3, the first semiconductor die 110 may also include a second surface 118 which is located at opposite side of the first redistribution structure 150 and may further include side surfaces 117 extending from edges of the first surface 119 to edges of the second surface 118. The first surface 119 of the first semiconductor die 110 may be an active surface at which integrated circuits of the first semiconductor die 110 are formed. The second surface 118 of the first semiconductor die 110 may be a bottom surface or a back side surface of the first semiconductor die 110. The terms "first," "second" etc. in the first surface 119 and the second surface 118 are only used to distinguish one element from another element, but not used to define only the element itself or to mean a particular sequence.

First contact pads 111 may be disposed on the first surface 119 of the first semiconductor die 110. The first contact pads 111 may act as conductive paths for electrically connecting the first semiconductor die 110 to an external device. The first contact pads 111 may correspond to edge pads which are disposed on both edge regions of the first semiconductor die 110.

The first left bridge die 120L may be disposed to be spaced apart from one of the side surfaces 117 of the first semiconductor die 110. The first left bridge die 120L may be disposed on the first redistribution structure 150 such that a side surface 127L of a body (corresponding to a first left body 129L) of the first left bridge die 120L faces any one of the side surfaces 117 of the first semiconductor die 110. The first left bridge die 120L may be configured to include first left post bumps 125L protruding from a top surface 128L of the first left body 129L. There may be a level difference H between the top surface 128L of the first left body 129L and the second surface 118 (i.e., top surface) of the first semiconductor die 110. The first left bridge die 120L may be disposed to be adjacent to a left side surface of the first semiconductor die 110 such that the top surface 128L of the first left body 129L of the first left bridge die 120L and the second surface 118 of the first semiconductor die 110 provide a step structure. The first left body 129L of the first left bridge die 120L may have a thickness which is less than a thickness of the first semiconductor die 110. The first left body 129L of the first left bridge die 120 may have a thickness corresponding to 40% to 90% of a thickness of the first semiconductor die 110. The first left body 129L of the first left bridge die 120L may have a thickness corresponding to approximately 50% of a thickness of the first semiconductor die 110.

The first left bridge die 120L may include first left through vias 123L vertically penetrating the first left body 129L of the first left bridge die 120L. The first left body 129L of the first left bridge die 120L may be comprised of a semiconductor material such as a silicon material. Since the first left body 129L of the first left bridge die 120L is comprised of a semiconductor material, the first left through vias 123L may be formed using a semiconductor process, for example, a silicon process. Thus, the first left through vias 123L may be formed to have a through silicon via (TSV) structure with a fine diameter D1. The TSV structure may have a diameter which is much less than a diameter of a through mold via (TMV) penetrating an EMC layer. The first left through vias 123L may be formed of a conductive metal material, for example, a copper material.

Since the first left body 129L of the first left bridge die 120L is thinner than the first semiconductor die 110, the first left through vias 123L vertically penetrating the first left body 129L of the first left bridge die 120L may have a length which is less than a thickness of the first semiconductor die 110. For example, if the first left body 129L of the first left bridge die 120L is as thick as the first semiconductor die 110, the first left through vias 123L vertically penetrating the first left body 129L of the first left bridge die 120L may be formed to have a length corresponding to a thickness of the first semiconductor die 110. However, since the first left body 129L of the first left bridge die 120L is thinner than the first semiconductor die 110 in an embodiment, the first left through vias 123L vertically penetrating the first left body 129L of the first left bridge die 120L may have a relatively short length as compared with a thickness of the first semiconductor die 110.

In order that the first left through vias 123 have a relatively increased length with a relatively reduced diameter, it may be necessary to increase an aspect ratio of via holes in which the first left through vias 123L are formed. However, there may be some limitations in increasing the aspect ratio of the via holes due to a difficulty of a process for forming the via holes. In other word, if a thickness of the first left body 129L of the first left bridge die 120L increases, a length of the via holes penetrating the first left body 129L of the first left bridge die 120L may increase and a diameter of the via holes may also increase. That is, it may be difficult to form the via holes having a relatively increased length with a relatively reduced diameter. According to an embodiment, since the first left body 129L of the first left bridge die 120L has a relatively reduced thickness as compared with the first semiconductor die 110, the via holes to be filled with the first left through vias 123L may have a relatively reduced length. Thus, the first left through vias 123L may be formed to have the fine diameter D1. As a result, it may be possible to increase the number of the first left through vias 123L formed in a limited area.

In addition, first left via pads 121L may be connected to lower ends of the first left through vias 123L, respectively. The first left via pads 121L may be may be disposed on a bottom surface of the first left body 129L of the first left bridge die 120L opposite to the first left post bumps 125L. The first left via pads 121L may be connected to the first left through vias 123L and may be formed to have a diameter which is greater than a diameter of the first left through vias 123L. The first left via pads 121L may be formed of a metal such as copper and aluminum.

The first left post bumps 125L may be electrically connected to upper portions of the first left through vias 123L, respectively. The first left post bumps 125L may be disposed to overlap with the first left through vias 123L in a plan view. The first left post bumps 125L may protrude from the top surface 128L of the first left body 129L to have a certain height such that lower portions of side surfaces 125L-S of the first left post bumps 125L face an upper portion of the side surface 117 of the first semiconductor die 110. The first inner molding layer 160 of the first sub-package 100 may be formed to cover the top surface 128L of the first left body 129L and to surround the side surfaces of the first left post bumps 125L. The first inner molding layer 160 may be formed to directly cover the side surfaces of the first left post bumps 125L and to expose top surfaces 125L-T of the first left post bumps 125L. A distance L1 between a top surface 160T of the first inner molding layer 160 and the top surface 128L of the first left body 129L may be greater than a distance L2 between the top surface 160-T of the first inner molding layer 160 and the second surface 118 of the first semiconductor die 110.

The inner connectors 510 may be bonded to the top surfaces 125L-T of the first left post bumps 125L, which are revealed by the first inner molding layer 160. As illustrated in FIG. 1, the inner connectors 510 may electrically connect the first left post bumps 125L to the second sub-package 200. As illustrated in FIG. 3, the first left post bumps 125L may substantially penetrate a portion of the first inner molding layer 160, which is located on the first left body 129L of the first left bridge die 120L. Accordingly, the first left post bumps 125L may extend electrical paths of the first left through vias 123L to the top surface 160T of the first inner molding layer 160.

Referring again to FIG. 3, the first left body 129L may include a semiconductor material. Thus, a space between the first left through vias 123L may be filled with a semiconductor material, for example, a silicon material. In contrast, the first inner molding layer 160 may include an insulation material. That is, a space between the first left post bumps 125L may be filled with a dielectric material of the first inner molding layer 160, for example, an epoxy molding compound (EMC) material.

Since the first left through vias 123L penetrate the first left body 129L comprised of a semiconductor material, an impedance value of each of the first left through vias 123L may increase as compared with a case that the first left through vias 123L penetrate a substrate comprised of a dielectric material such as an EMC material. In addition, if the number of the first left through vias 123L in a unit area increases, a distance between the first left through vias 123L may be reduced to more severely cause signal noises such as crosstalk between the first left through vias 123L. The signal noises between the first left through vias 123L may affect a signal transmission characteristic or a signal integrity at a high frequency. According to an embodiment, since a space between the first left post bumps 125L is filled with a dielectric layer such as an EMC material having a relatively low dielectric constant as compared with a semiconductor material, a crosstalk phenomenon between the first left post bumps 125L may be more effectively suppressed. At a room temperature and at a frequency of 1 KHz, a silicon material may have a dielectric constant of approximately 11.68 and an EMC material may have a dielectric constant of approximately 3.7. The dielectric constant difference between the first inner molding layer 160 and the first left body 129L may influence an electrical characteristic of the first sub-package 100.

The first left post bumps 125L may have a second diameter D2 which is greater than the first diameter D1 of the first left through vias 123L. Since the first diameter D1 corresponding to a diameter of the first left through vias 123L is less than the second diameter D2 corresponding to a diameter of first left post bumps 125L, a distance between the first left through vias 123L may be relatively greater than a distance between the first left post bumps 125L. Accordingly, signal noises between the first left through vias 123L may be efficiently suppressed.

As described above, increase of a distance between the first left through vias 123L may be required in order to suppress generation of the signal noises between the first left through vias 123L. In order to increase a distance between the first left through vias 123L, it may be necessary to reduce the first diameter D1 of the first left through vias 123L. If a process for forming the first left through vias 123L exhibits a certain and fixed aspect ratio, it may be necessary to reduce a thickness of the first left body 129L of the first left bridge die 120L in order to obtain a fine diameter of the first left through vias 123L. According to an embodiment, since the first left body 129L of the first left bridge die 120L has a thickness which is less than a thickness of the first semiconductor die 110, the first left through vias 123L may be formed to have the first diameter D1 corresponding to a fine diameter. Thus, a distance between the first left through vias 123L may increase to suppress generation of signal noises between the first left through vias 123L.

The first left post bumps 125L may be metal post bumps including a copper material. The second diameter D2 of the first left post bumps 125L may be within the range of approximately 20 micrometers to approximately 30 micrometers. In contrast, the first diameter D1 of the first left through vias 123L may be approximately 0.5 micrometers. Since the first left post bumps 125L are formed to have the second diameter D2 corresponding to a relatively large diameter, it may be possible to directly bond the inner connectors (510 of FIG. 1) such as solder balls or bumps to the top surfaces 125L-T of the first left post bumps 125L without misalignment. That is, the inner connectors (510 of FIG. 1) may be directly bonded to the top surfaces 125L-T of the first left post bumps 125L without using any additional conductive pads for increasing a contact area of the first left post bumps 125L.

Referring to FIGS. 1 and 3, while the first left bridge die 120L is located at a left side of the first semiconductor die 110, the first right bridge die 120R may be located at a right side of the first semiconductor die 110. The first right bridge die 120R may be realized to have substantially the same shape and the same configuration as the first left bridge die 120L. The first right bridge die 120R may be configured to include a first right body 129R corresponding to the first left body 129L, first right through vias 123R corresponding to the first left through vias 123L, and first right post bumps 125R corresponding to the first left post bumps 125L.

Referring again to FIG. 1, the first inner molding layer 160 may be formed on a surface of the first redistribution structure 150 to cover the first right bridge die 120R. The first inner molding layer 160 may have an extension part 160E laterally protruding from side surfaces 200S of the second sub-package 200 stacked on the first sub-package 100, as illustrated in FIG. 1. Since the first inner molding layer 160 of the first sub-package 100 has the extension part 160E, the first sub-package 100 may have a width which is greater than a width of the second sub-package 200 stacked on the first sub-package 100. Thus, the first sub-package 100 may act as a base structure while the second sub-package 200 is stacked on the first sub-package 100.

Referring to FIGS. 1 and 4, the second sub-package 200 may be provided as a single package unit vertically stacked on the first sub-package 100 in the stack package 10.

The second sub-package 200 may include a second semiconductor die 210, a second left bridge die 220L and a second right bridge die 220R which are disposed on a second redistribution structure 250. The second left bridge die 220L may be located at a left side of the second semiconductor die 210, and the second right bridge die 220R may be located at a right side of the second semiconductor die 210.

The second semiconductor die 210 may be a semiconductor die having a shape and function similar to the first semiconductor die 110. The second semiconductor die 210 may be a memory semiconductor die having substantially the same shape and function as the first semiconductor die 110. Second contact pads 211 may be disposed on a surface of the second semiconductor die 210 like the first contact pads 111 disposed on the first semiconductor die 110. The second contact pads 211 may correspond to edge pads which are disposed on both edge regions of the second semiconductor die 210.

Referring to FIGS. 1, 3 and 4, each of the second left and right bridge dies 220L and 220R may have substantially the same structure or configuration as the first left bridge die 120L. For example, the second left bridge die 220L may be configured to include a second left body 229L corresponding to the first left body 129L, second left through vias 223L corresponding to the first left through vias 123L, second left post bumps 225L corresponding to the first left post bumps 125L, and second left via pads 221L corresponding to the first left via pads 121L.

The second sub-package 200 may be configured to include a second inner molding layer 260 that is disposed on the second redistribution structure 250 to cover and protect the second semiconductor die 210, the second left bridge die 220L and the second right bridge die 220R. The second inner molding layer 260 may be substantially the same material as the first inner molding layer 160. The second inner molding layer 260 may be formed to fill gaps between the second semiconductor die 210, the second left bridge die 220L and the second right bridge die 220R which are disposed on the second redistribution structure 250.

Referring to FIGS. 2 and 3, a fifth semiconductor die 210-1 may be disposed side by side with the second semiconductor die 210 on the second redistribution structure 250. The fifth semiconductor die 210-1 may be a semiconductor die having substantially the same shape and function as the second semiconductor die 210. The fifth semiconductor die 210-1 may be a DRAM die like the second semiconductor die 210. As the fifth semiconductor die 210-1 is additionally disposed side by side with the second semiconductor die 210, a total data storage capacity of the second sub-package 200 may be substantially twice that of the second semiconductor die 210.

As illustrated in FIG. 2, a fifth left bridge die 220L-1 may be additionally disposed at a left side of the fifth semiconductor die 210-1, and a fifth right bridge die 220R-1 may be additionally disposed at a right side of the fifth semiconductor die 210-1. The fifth right bridge die 220R-1 may have substantially the same structure as the second right bridge die 220R, and the fifth left bridge die 220L-1 may have substantially the same structure as the second left bridge die 220L.

Although not shown in the drawings, each of the first, third and fourth sub-packages 100, 300 and 400 may further include an additional semiconductor die and additional left and right bridge dies as the second sub-package 200 further includes the fifth semiconductor die 210-1, the fifth left bridge die 220L-1 and the fifth right bridge die 220R-1. In such a case, it may be possible to increase a capacity of the stack package 10.

Referring again to FIG. 1, the third sub-package 300 may be vertically stacked on a surface of the second sub-package 200 opposite to the first sub-package 100. The third sub-package 300 may be provided as a single package unit different from the second sub-package 200. The third sub-package 300 may have substantially the same structure or shape as the second sub-package 200. For example, the third sub-package 300 may be configured to include a third semiconductor die 310, a third left bridge die 320L and a third right bridge die 320R which are disposed on a third redistribution structure 350 to be spaced apart from each other.

The fourth sub-package 400 may be vertically stacked on a surface of the third sub-package 300 opposite to the second sub-package 200. The fourth sub-package 400 may be provided as a single package unit different from the third sub-package 300. The fourth sub-package 400 may have substantially the same structure or shape as the second sub-package 200. For example, the fourth sub-package 400 may be configured to include a fourth semiconductor die 410, a fourth left bridge die 420L and a fourth right bridge die 420R which are disposed on a fourth redistribution structure 450 to be spaced apart from each other.

Referring again to FIGS. 1 and 3, the first redistribution structure 150 of the first sub-package 100 may be configured to include first redistributed lines 151, first redistributed pads 153 and outer redistributed lines 155. The first redistributed lines 151, the first redistributed pads 153 and the outer redistributed lines 155 may be formed of a conductive layer including a metal layer such as an aluminum layer, a copper layer or a gold layer.

The first redistributed lines 151 may be conductive lines for electrically connecting a first bridge die 120 including the first left and right bridge dies 120L and 120R to the first semiconductor die 110. As illustrated in FIG. 3, although the first redistributed pads 153 are disposed to vertically overlap with and to be in contact with the first left via pads 121L, the first redistributed pads 153 may be isolated conductive patterns that are electrically insulated from the first semiconductor die 110.

The first redistribution structure 150 may include a first dielectric layer 152 revealing the first contact pads 111 of the first semiconductor die 110 and the first left via pads 121L of the first left bridge die 120L. The first redistributed lines 151 and the first redistributed pads 153 may be disposed on a surface of the first dielectric layer 152 opposite to the first semiconductor die 110. The outer redistributed lines 155 may be conductive patterns for extending electric paths of the first redistributed lines 151. The first redistribution structure 150 may further include a second dielectric layer 154 electrically isolating the first redistributed lines 151 and the first redistributed pads 153 from each other and revealing a portion of each of the first redistributed lines 151 and portions of the first redistributed pads 153. The outer redistributed lines 155 may be disposed on a bottom surface of the second dielectric layer 154 such that first ends of the outer redistributed lines 155 respectively overlap with the revealed portions of the first redistributed lines 151 or the revealed portions of the first redistributed pads 153.

The outer redistributed lines 155 may be located at a different level from the first redistributed lines 151 and the first redistributed pads 153. The first redistribution structure 150 may further include a third dielectric layer 156 electrically isolating the outer redistributed lines 155 from each other and revealing a portion of each of the outer redistributed lines 155. The first to third dielectric layers 152, 154 and 156 may provide a dielectric structure that electrically isolates the first redistributed lines 151, the first redistributed pads 153 and the outer redistributed lines 155 from each other. Portions of the outer redistributed lines 155 may be revealed by holes penetrating the third dielectric layer 156, and the outer connectors 590 may be attached or bonded to the revealed portions of the outer redistributed lines 155. The outer redistributed lines 155 may be introduced to extend electrical paths of the first redistributed lines 151 or the first redistributed pads 153 to the outer connectors 590.

Referring again to FIGS. 1 and 4, the second redistribution structure 250 of the second sub-package 200 may be configured to include second redistributed lines 251 and first redistributed pads 153. The second redistributed lines 251 may be conductive patterns that electrically connect the second semiconductor die 210 to a second bridge die 220. The second bridge die 220 may include the second left bridge die 220L and the second right bridge die 220R. Although the second redistributed pads 253 of FIG. 1 are disposed to vertically overlap with the second left via pads 221L, the second redistributed pads 253 may be isolated conductive patterns that are electrically insulated from the second semiconductor die 210.

The second redistribution structure 250 may further include a fourth dielectric layer 252 revealing the second contact pads 211 of the second semiconductor die 210 and the second left via pads 221L of the second left body 229L of the second left bridge die 220L. The second redistributed lines 251 and the second redistributed pads 253 may be disposed on a surface of the fourth dielectric layer 252 opposite to the second semiconductor die 210. The second redistribution structure 250 may further include a fifth dielectric layer 254 electrically isolating the second redistributed lines 251 and the second redistributed pads 253 from each other and revealing a portion of each of the second redistributed lines 251 and portions of the second redistributed pads 253. The inner connectors 510 may be attached or bonded to the revealed portions of the second redistributed lines 251 or the revealed portions of the second redistributed pads 253.

Referring again to FIG. 1, the third and fourth sub-packages 300 and 400 may include the third redistribution structure 350 and the fourth redistribution structure 450, respectively. Each of the third and fourth redistribution structures 350 and 450 may have substantially the same configuration as the second redistribution structure 250. For example, the third redistribution structure 350 of the third sub-package 300 may be configured to include third redistributed lines 351 and third redistributed pads 353. The third redistributed lines 351 may be conductive patterns that electrically connect a third bridge die 320 to the third semiconductor die 310. The third bridge die 320 may include the third left bridge die 320L and the third right bridge die 320R. The third redistributed pads 353 may be isolated conductive patterns that are electrically insulated from the third semiconductor die 310.

The fourth redistribution structure 450 of the fourth sub-package 400 may be configured to include fourth redistributed lines 451 and fourth redistributed pads 453. The fourth redistributed lines 451 may be conductive patterns that electrically connect a fourth bridge die 420 to the fourth semiconductor die 410. The fourth bridge die 420 may include the fourth left bridge die 420L and the fourth right bridge die 420R. The fourth redistributed pads 453 may be isolated conductive patterns that are electrically insulated from the fourth semiconductor die 410.

Figure 5:
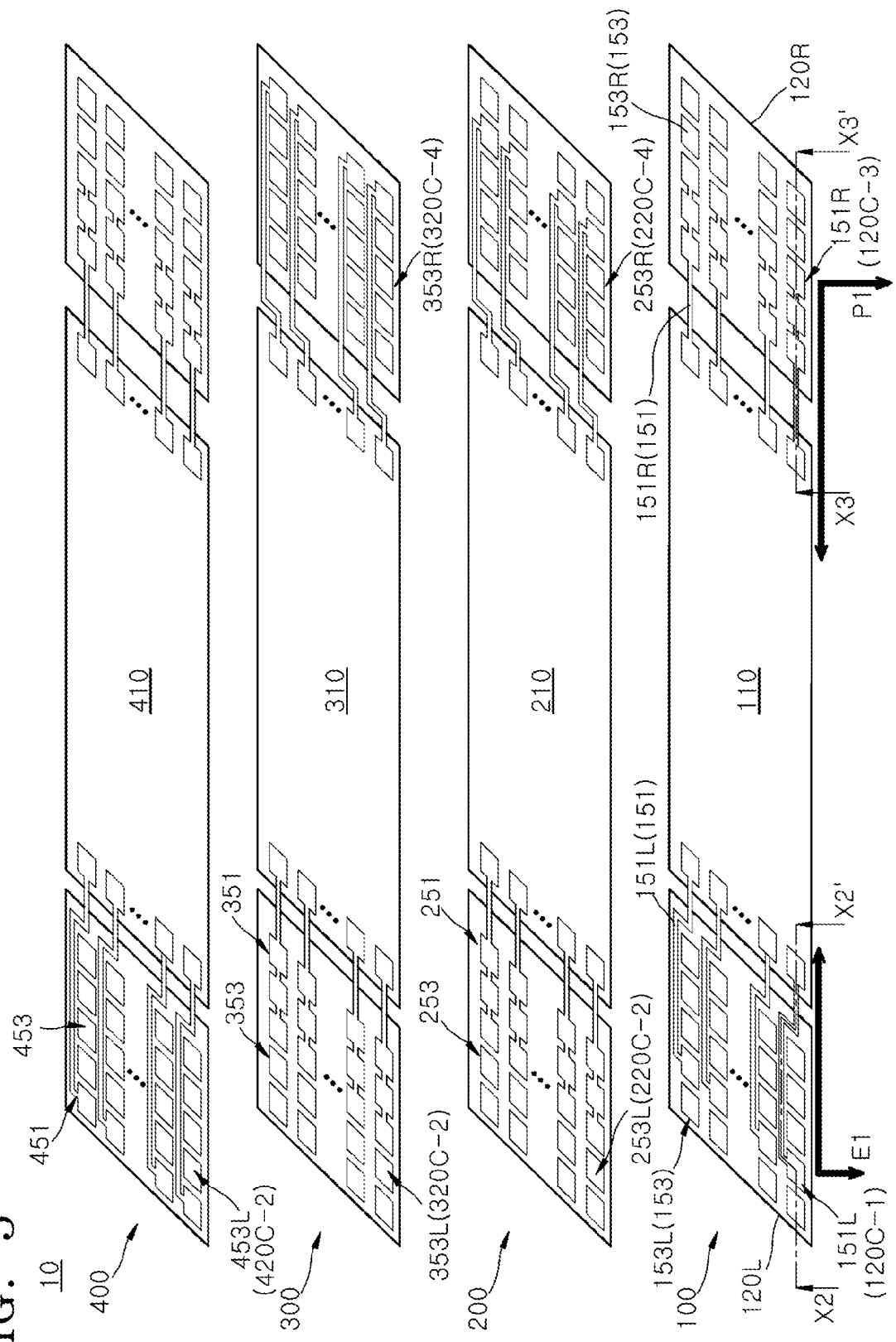
FIG. 5 is a schematic view illustrating a first electric path and a first power supply path of a first sub-package included in the stack package of FIG. 1.
Figure 6:
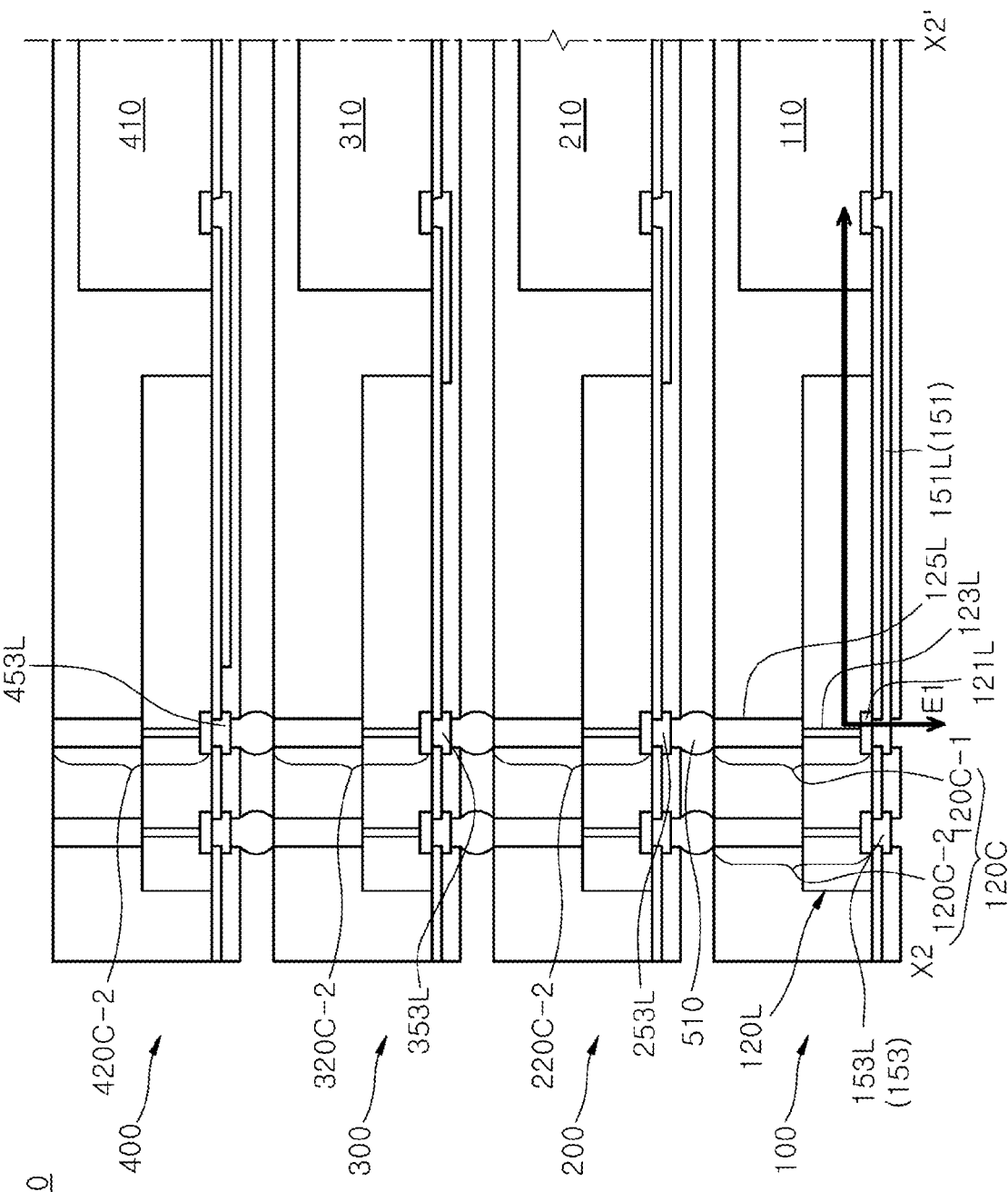
FIG. 6 is a cross-sectional view of a stack package taken along a line X2-X2' of FIG. 5.
Figure 7:
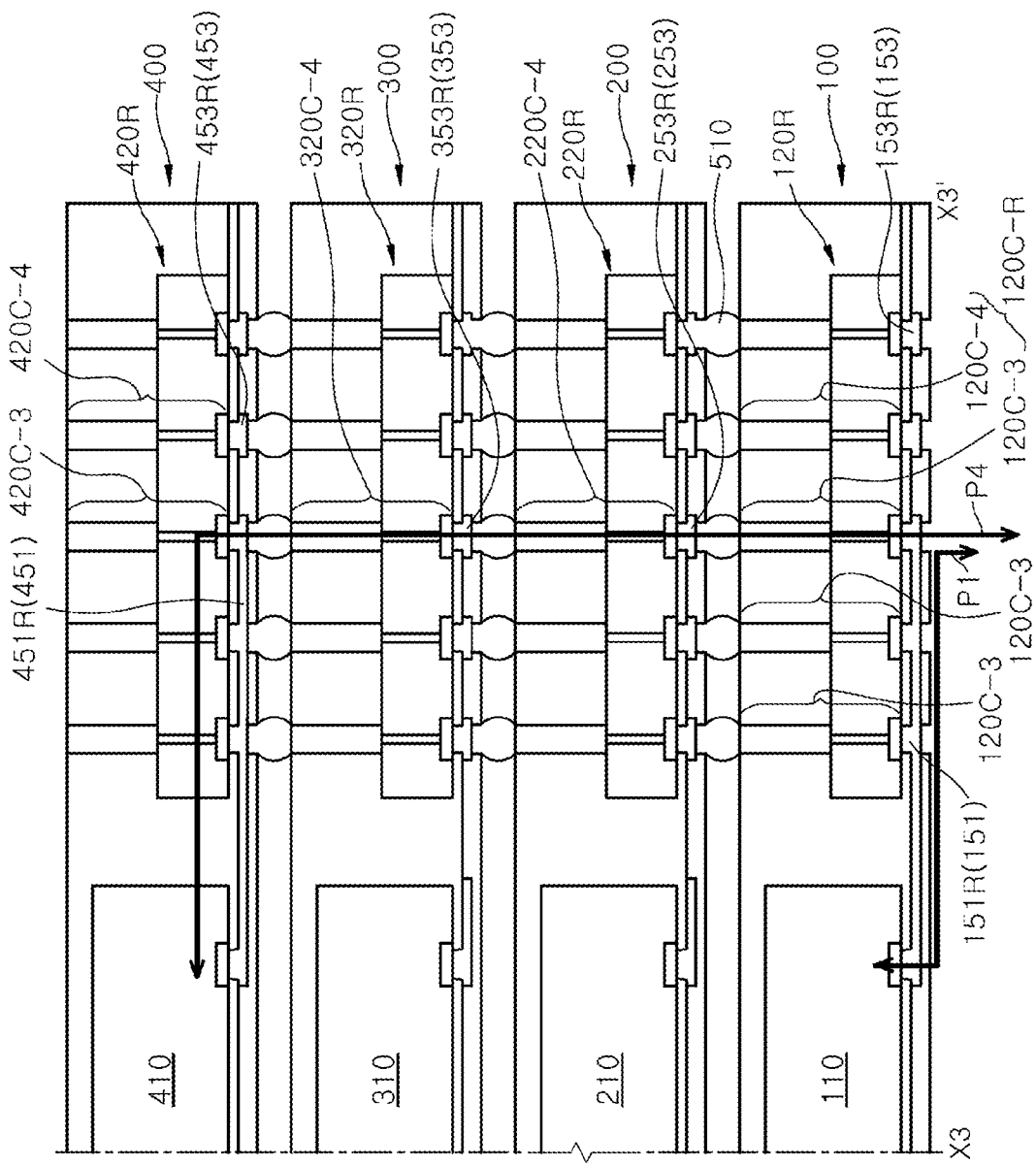
FIG. 7 is a cross-sectional view of a stack package taken along a line X3-X3' of FIG. 5.

FIG. 5 is a schematic view illustrating a first electric path E1 and a first power supply path P1 formed in the first sub-package 100 included in the stack package 10 of FIG. 1. Moreover, FIG. 5 schematically illustrates disposition of the redistributed lines 151, 251, 351 and 451 and the redistributed pads 153, 253, 353 and 453 of the sub-packages 100, 200, 300 and 400. FIG. 6 is a cross-sectional view of the stack package 10, which is taken along a line X2-X2' of FIG. 5, and FIG. 7 is a cross-sectional view of the stack package 10, which is taken along a line X3-X3' of FIG. 5.

Referring to FIG. 5, the stack package 10 may be configured to include the first to fourth sub-packages 100, 200, 300 and 400 which are vertically stacked. The first to fourth sub-packages 100, 200, 300 and 400 may be configured to include the first to fourth redistributed lines 151, 251, 351 and 451, respectively. In addition, the first to fourth sub-packages 100, 200, 300 and 400 may be configured to include the first to fourth redistributed pads 153, 253, 353 and 453, respectively. The first to fourth redistributed lines 151, 251, 351 and 451 as well as the first to fourth redistributed pads 153, 253, 353 and 453 may be disposed to provide electric paths of the first to fourth sub-packages 100, 200, 300 and 400.

Referring to FIGS. 5 and 6, the first sub-package 100 may include first left redistributed lines 151L corresponding to some of the first redistributed lines 151. The first left redistributed lines 151L may electrically connect the first left bridge die 120L to the first semiconductor die 110. The first left redistributed lines 151L may be conductive patterns that extend from the first semiconductor die 110 to the first left bridge die 120L. The first left redistributed lines 151L may be disposed to provide the first electric path E1 that electrically connects the first semiconductor die 110 to the first left bridge die 120L. The first electric path E1 may include signal lines through which signals such as input/output (I/O) data are transmitted. Although the first electric path E1 is electrically connected to the first semiconductor die 110, the first electric path E1 may be electrically disconnected and isolated from the second, third and fourth semiconductor dies 210, 310 and 410. The first electric path E1 may be disposed to electrically bypass the second, third and fourth semiconductor dies 210, 310 and 410.

The first left redistributed lines 151L may be conductive patterns that electrically connect the first semiconductor die 110 to first left vertical interconnectors 120C-1 for connection of the first left bridge die 120L. The first left redistributed lines 151L may be electrically disconnected and isolated from first left vertical interconnectors 120C-2 for bypass of the first left bridge die 120L. First left redistributed pads 153L may be disposed to vertically overlap with the first left vertical interconnectors 120C-2 for bypass and may be coupled to the first left vertical interconnectors 120C-2 for bypass. The first left redistributed pads 153L may correspond to some of the first redistributed pads 153 and may be conductive patterns that are electrically isolated from the first left redistributed lines 151L. Since the first left redistributed pads 153L are electrically isolated from the first semiconductor die 110, the first left vertical interconnectors 120C-2 for bypass bonded to the first left redistributed pads 153L may also be electrically isolated from the first semiconductor die 110.

The first left bridge die 120L may include a plurality of first left vertical interconnectors 120C. The first left vertical interconnectors 120C may correspond to vertical electric paths or vertical interconnection paths including the first left through vias 123L and the first left post bumps 125L. The first left vertical interconnectors 120C may further include the first left via pads 121L which are connected to the first left through vias 123L. Some of the first left vertical interconnectors 120C may correspond to the first left vertical interconnectors 120C-1 for connection, and the others of the first left vertical interconnectors 120C may correspond to the first left vertical interconnectors 120C-2 for bypass.

In the present specification, the term "vertical interconnector" may be construed as a vertical electric path including a through via and a post bump that are disposed in a bridge die to be coupled to each other. A vertical interconnector for bypass may be a vertical interconnector such as the first left vertical interconnector 120C-2 for bypass. The vertical interconnector for bypass may be construed as a vertical interconnector that is electrically disconnected and isolated from a semiconductor die included in a sub-package having the vertical interconnector for bypass. A vertical interconnector for connection such as the first left vertical interconnector 120C-1 for connection may be construed as a vertical interconnector that is electrically connected to a semiconductor die included in a sub-package having the vertical interconnector for connection.

Referring again to FIGS. 5 and 6, the first left vertical interconnectors 120C-1 for connection may be electrically connected to second left redistributed pads 253L and second left vertical interconnectors 220C-2 for bypass, which are disposed in the second sub-package 200, through the inner connectors 510. The second left vertical interconnectors 220C-2 for bypass may be electrically connected to third left redistributed pads 353L and third left vertical interconnectors 320C-2 for bypass which are disposed in the third sub-package 300. The third left vertical interconnectors 320C-2 for bypass may be electrically connected to fourth left redistributed pads 453L and fourth left vertical interconnectors 420C-2 for bypass which are disposed in the fourth sub-package 400. The second left redistributed pads 253L may correspond to some of the second redistributed pads (253 of FIG. 1), and the third left redistributed pads 353L may correspond to some of the third redistributed pads (353 of FIG. 1). Moreover, the fourth left redistributed pads 453L may correspond to some of the fourth redistributed pads (453 of FIG. 1).

All of the second to fourth left redistributed pads 253L, 353L and 453L may be electrically disconnected from the second to fourth semiconductor dies 210, 310 and 410. Thus, all of the second to fourth left vertical interconnectors 220C-1, 320C-2 and 420C-2 for bypass may also be electrically disconnected from the second to fourth semiconductor dies 210, 310 and 410. Accordingly, the first left vertical interconnectors 120C-1 for connection may be electrically disconnected from the second to fourth semiconductor dies 210, 310 and 410. The first left redistributed lines 151L connected to the first left vertical interconnectors 120C-1 for connection may be electrically disconnected from the second to fourth semiconductor dies 210, 310 and 410 and may be disposed to provide electric paths bypassing the second to fourth semiconductor dies 210, 310 and 410.

The second to fourth left vertical interconnectors 220C-1, 320C-2 and 420C-2 for bypass vertically connected to the first left vertical interconnectors 120C-1 for connection may be electrically connected to the first electric path E1. However, the second to fourth left vertical interconnectors 220C-1, 320C-2 and 420C-2 for bypass may be electrically disconnected from the second to fourth semiconductor dies 210, 310 and 410. Thus, the first electric path E1 may provide signal paths that are electrically connected to only the first semiconductor die 110.

Referring to FIGS. 5 and 7, the first sub-package 100 may include first right redistributed lines 151R corresponding to the others of the first redistributed lines 151. The first right redistributed lines 151R may electrically connect the first right bridge die 120R to the first semiconductor die 110. The first right redistributed lines 151R may be conductive patterns that extend from the first semiconductor die 110 to the first right bridge die 120R. The right bridge die 120R may have a configuration similar to the first left bridge die (120L of FIG. 6). However, an internal configuration of the right bridge die 120R may be designed to be different from an internal configuration of the first left bridge die 120L.

The first right redistributed lines 151R may be disposed to provide the first power supply path P1 that electrically connects the first semiconductor die 110 to the first right bridge die 120R. The first power supply path P1 may include a power line through which a power supply voltage is transmitted and/or a ground line through which a ground voltage is transmitted. Although the first power supply path P1 is electrically connected to the first semiconductor die 110, the first power supply path P1 may be electrically disconnected and isolated from the second and third semiconductor dies 210 and 310. The first power supply path P1 may be disposed to electrically bypass the second and third semiconductor dies 210 and 310. In some embodiments, an electrical pathway may be a power supply path. In other embodiments, an electrical pathway may be an electric path.

The first right redistributed lines 151R may be conductive patterns that electrically connect the first semiconductor die 110 to first right vertical interconnectors 120C-3 for connection of the first right bridge die 120R. The first right redistributed lines 151R may be electrically disconnected and isolated from first right vertical interconnectors 120C-4 for bypass of the first right bridge die 120R. First right redistributed pads 153R may be electrically coupled to the first right vertical interconnectors 120C-4 for bypass. The first right redistributed pads 153R may correspond to the others of the first redistributed pads 153 and may be conductive patterns that are electrically isolated from the first right redistributed lines 151R. Since the first right redistributed pads 153R are electrically isolated from the first semiconductor die 110, the first right vertical interconnectors 120C-4 for bypass bonded to the first right redistributed pads 153R may also be electrically isolated from the first semiconductor die 110. The first right vertical interconnectors 120C-3 for connection and the first right vertical interconnectors 120C-4 for bypass may constitute first right vertical interconnectors 120C-R.

The first right vertical interconnectors 120C-3 for connection may be electrically connected to second right vertical interconnectors 220C-4 for bypass of the second sub-package 200 through the inner connectors 510. The second right vertical interconnectors 220C-4 for bypass may be electrically connected to third right vertical interconnectors 320C-4 for bypass of the third sub-package 300. Second right redistributed pads 253R connected to the second right vertical interconnectors 220C-4 for bypass may correspond to some of the second redistributed pads (253 of FIG. 1), and third right redistributed pads 353R connected to the third right vertical interconnectors 320C-4 for bypass may correspond to some of the third redistributed pads (353 of FIG. 1).

All of the second and third right redistributed pads 253R and 353R may be electrically disconnected from the second and third semiconductor dies 210 and 310. Thus, both of the second and third right vertical interconnectors 220C-4 and 320C-4 for bypass may also be electrically disconnected from the second and third semiconductor dies 210 and 310. Accordingly, the first right vertical interconnectors 120C-3 for connection may be electrically disconnected from the second and third semiconductor dies 210 and 310. The first right redistributed lines 151R connected to the first right vertical interconnectors 120C-3 for connection may be electrically disconnected from the second and third semiconductor dies 210 and 310 and may be disposed to provide electric paths bypassing the second and third semiconductor dies 210 and 310.

Figure 8:
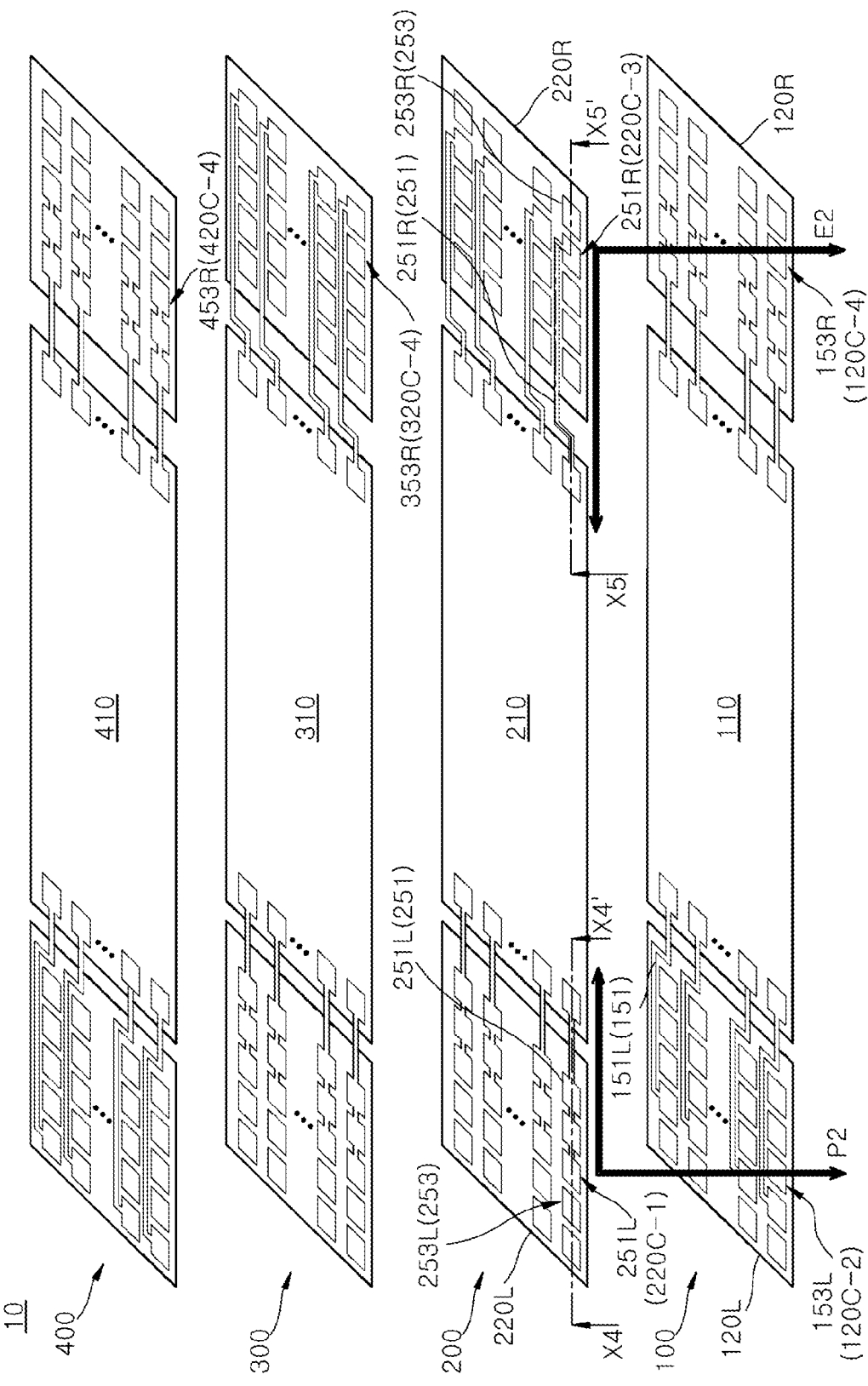
FIG. 8 is a schematic view illustrating a second electric path and a second power supply path of a second sub-package included in the stack package of FIG. 1.
Figure 9:
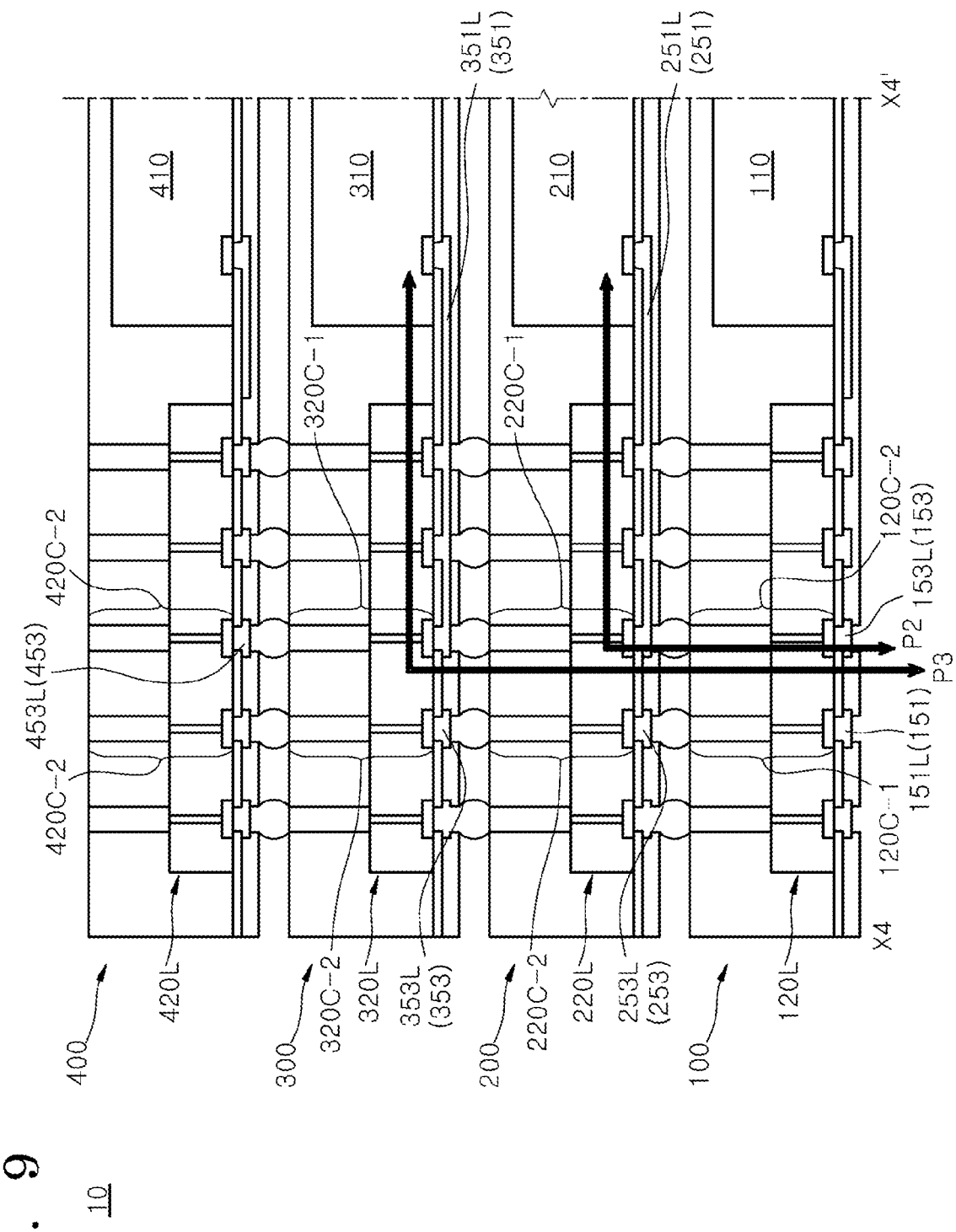
FIG. 9 is a cross-sectional view of a stack package taken along a line X4-X4' of FIG. 8.
Figure 10:
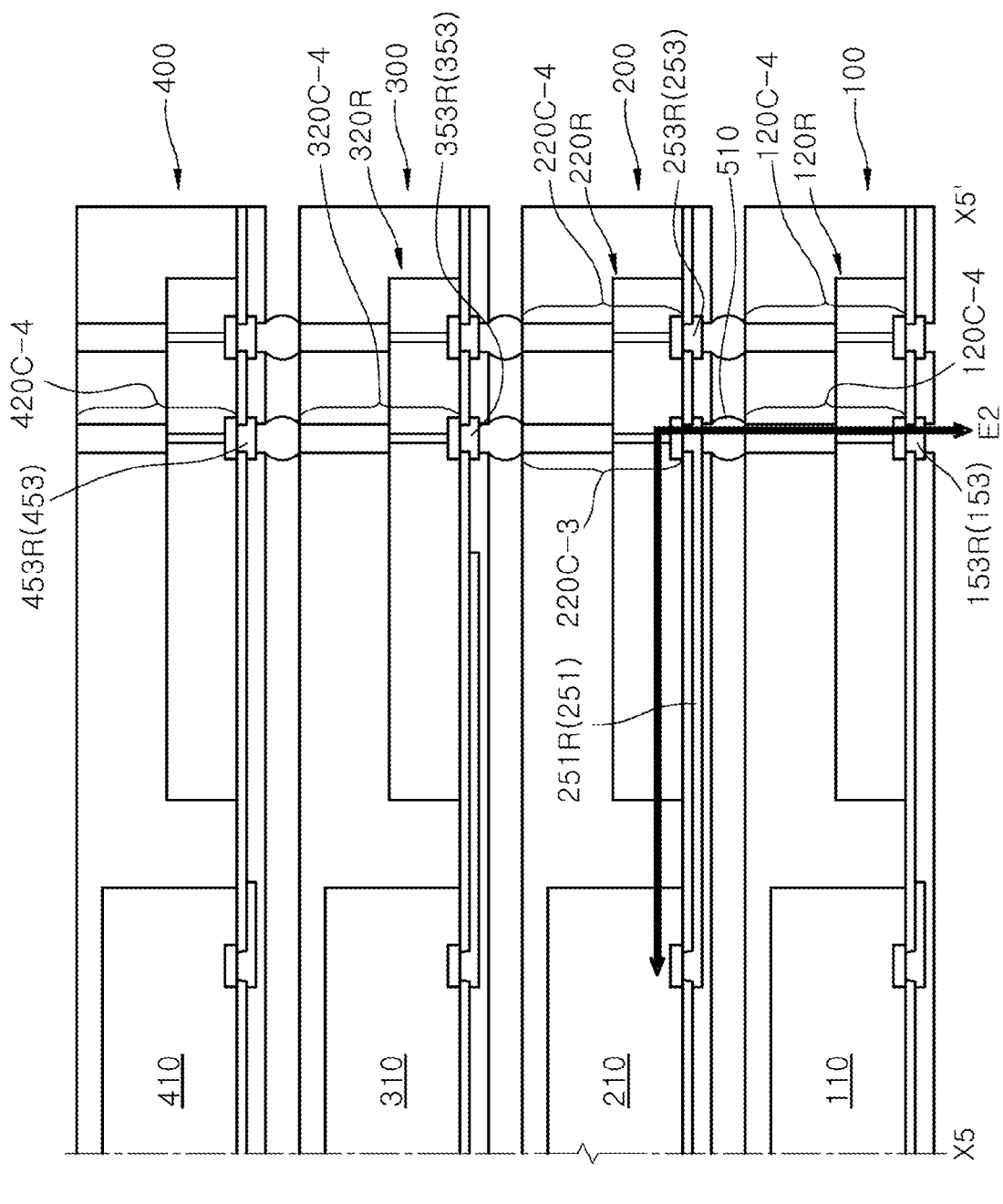
FIG. 10 is a cross-sectional view of a stack package taken along a line X5-X5' of FIG. 8.

FIG. 8 is a schematic view illustrating a second electric path E2 and a second power supply path P2 formed in the second sub-package 200 included in the stack package 10 of FIG. 1. FIG. 9 is a cross-sectional view of the stack package 10, which is taken along a line X4-X4' of FIG. 8, and FIG. 10 is a cross-sectional view of the stack package 10, which is taken along a line X5-X5' of FIG. 8.

Referring to FIGS. 8 and 9, the second sub-package 200 may include second left redistributed lines 251L corresponding to some of the second redistributed lines 251. The second left redistributed lines 251L may be conductive patterns that electrically connect the second left bridge die 220L to the second semiconductor die 210. The second left bridge die 220L may be disposed to vertically overlap with the first left bridge die 120L and may be configured to have a structure similar to the first left bridge die 120L. The second left bridge die 220L may be electrically connected to the second semiconductor die 210 through the second left redistributed lines 251L, and the second left redistributed lines 251L may constitute the second power supply path P2. The second power supply path P2 may include a power line supplying a power supply voltage to the second semiconductor die 210 and/or a ground line supplying a ground voltage to the second semiconductor die 210. While the second power supply path P2 is electrically connected to the second semiconductor die 210, the second power supply path P2 may be electrically disconnected and isolated from the first and fourth semiconductor die 110 and 410. The second power supply path P2 may be disposed to electrically bypass the first and fourth semiconductor dies 110 and 410.

The second left redistributed lines 251L may be conductive patterns that electrically connect the second semiconductor die 210 to the second left vertical interconnectors 220C-1 for connection disposed in the second left bridge die 220L. The second left redistributed lines 251L may be electrically disconnected and isolated from the second left vertical interconnectors 220C-2 for bypass. The second left redistributed pads 253L may be coupled to the second left vertical interconnectors 220C-2 for bypass. The second left redistributed pads 253L may correspond to the others of the second redistributed pads 253 and may be conductive patterns that are electrically isolated from the second left redistributed lines 251L. Since the second left redistributed pads 253L are electrically isolated from the second semiconductor die 210, the second left vertical interconnectors 220C-2 for bypass bonded to the second left redistributed pads 253L may also be electrically isolated from the second semiconductor die 210.

The second left vertical interconnectors 220C-1 for connection may be electrically connected to the first left vertical interconnectors 120C-2 for bypass, and the first left vertical interconnectors 120C-2 for bypass may constitute the second power supply path P2. The first left redistributed pads 153L may be coupled to the first left vertical interconnectors 120C-2 for bypass. The second power supply path P2 including the first left vertical interconnectors 120C-2 may be electrically isolated from the first semiconductor die 110. Thus, the second left vertical interconnectors 220C-1 for connection may be electrically isolated from the first semiconductor die 110 to electrically bypass the first semiconductor die 110.

Referring to FIGS. 8 and 10, the second sub-package 200 may include second right redistributed lines 251R corresponding to the others of the second redistributed lines 251. The second right redistributed lines 251R may electrically connect the second right bridge die 220R to the second semiconductor die 210. The second right redistributed lines 251R may be conductive patterns that extend from the second semiconductor die 210 to the second right bridge die 220R. The second right bridge die 220R may have a configuration similar to the second left bridge die 220L.

The second right redistributed lines 251R may be disposed to provide the second electric path E2 that electrically connects the second right bridge die 220R to the second semiconductor die 210. The second electric path E2 may include signal lines through which signals such as input/output (I/O) data are transmitted. While the second electric path E2 is electrically connected to the second semiconductor die 210, the second electric path E2 may be electrically disconnected and isolated from the first, third and fourth semiconductor dies 110, 310 and 410. The second electric path E2 may be disposed to electrically bypass the first, third and fourth semiconductor dies 110, 310 and 410.

The second right redistributed lines 251R may be conductive patterns that electrically connect the second semiconductor die 210 to second right vertical interconnectors 220C-3 for connection disposed in the second right bridge die 220R. The second right redistributed lines 251R may be electrically disconnected and isolated from the second right vertical interconnectors 220C-4 for bypass of the second right bridge die 220R. The second right redistributed pads 253R may be electrically coupled to the second right vertical interconnectors 220C-4 for bypass. The second right vertical interconnectors 220C-4 for bypass and the second right redistributed pads 253R may be electrically isolated from the second semiconductor die 210 and may be disposed to electrically bypass the second semiconductor die 210.

The second right vertical interconnectors 220C-3 for connection may be electrically connected to the first right vertical interconnectors 120C-4 for bypass and the first right redistributed pads 153R of the first sub-package 100. The first right vertical interconnectors 120C-4 for bypass and the first right redistributed pads 153R may be electrically connected to the second right redistributed lines 251R through the inner connectors 510. The second electric path E2 may include the second right redistributed lines 251R, the first right vertical interconnectors 120C-4 for bypass and the first right redistributed pads 153R. Since the first right vertical interconnectors 120C-4 for bypass and the first right redistributed pads 153R are electrically disconnected and isolated from the first semiconductor die 110, the second electric path E2 may be electrically isolated from the first semiconductor die 110.

The second right vertical interconnectors 220C-3 for connection may be electrically connected to the third right vertical interconnectors 320C-4 for bypass and the third right redistributed pads 353R of the third sub-package 300. Since the third right vertical interconnectors 320C-4 for bypass and the third right redistributed pads 353R are electrically isolated from the third semiconductor die 310, the second electric path E2 and the second right vertical interconnectors 220C-3 for connection may be electrically isolated from the third semiconductor die 310.

The second right vertical interconnectors 220C-3 for connection may be electrically connected to fourth right redistributed pads 453R and fourth right vertical interconnectors 420C-4 for bypass of the fourth sub-package 400 through the third right redistributed pads 353R and the third right vertical interconnectors 320C-4 for bypass. Since the fourth right redistributed pads 453R and the fourth right vertical interconnectors 420C-4 for bypass are electrically isolated from the fourth semiconductor die 410, the second electric path E2 and the second right vertical interconnectors 220C-3 for connection may be electrically isolated from the fourth semiconductor die 410.

Figure 11:
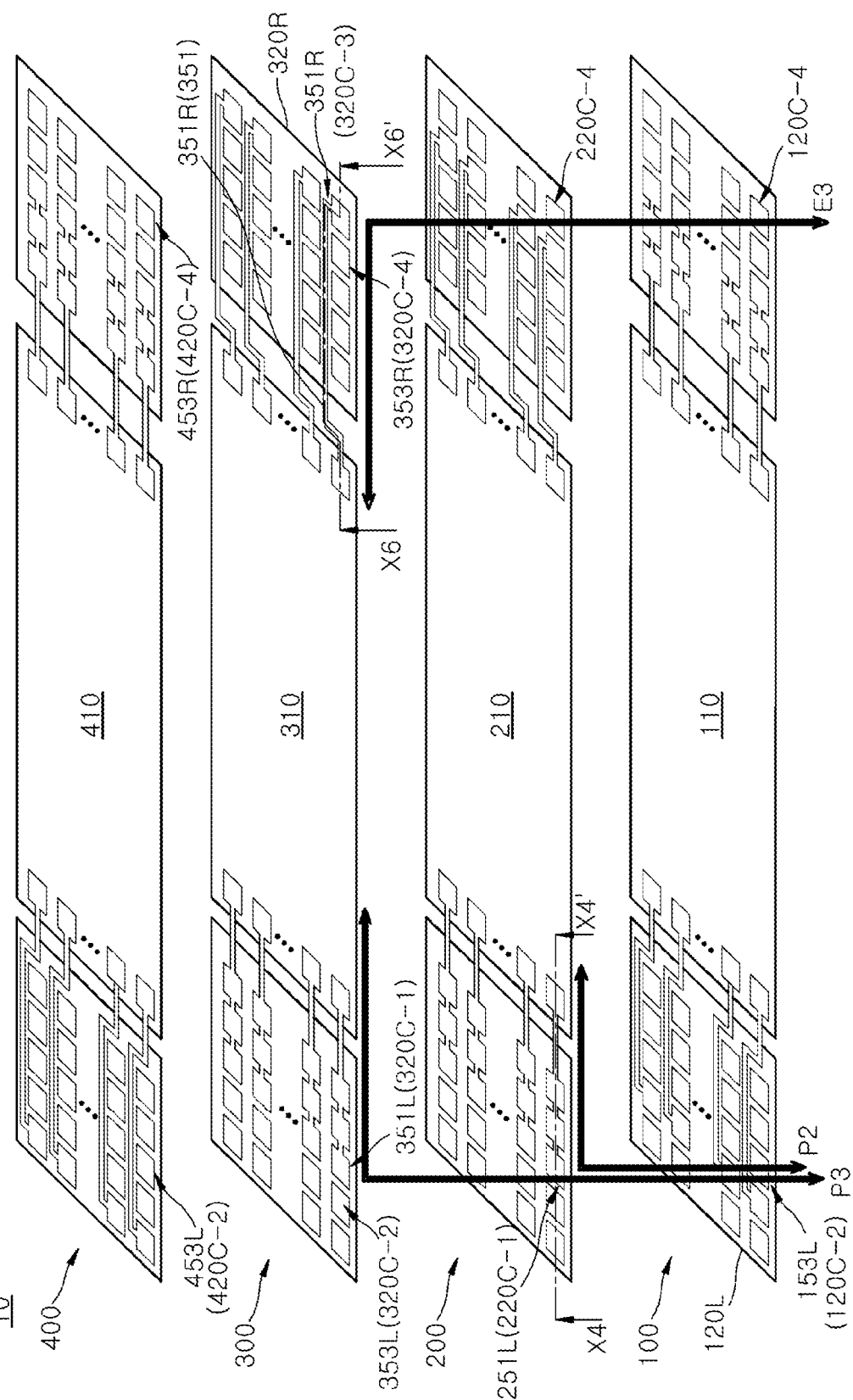
FIG. 11 is a schematic view illustrating a third electric path and a third power supply path of a third sub-package included in the stack package of FIG. 1.
Figure 12:
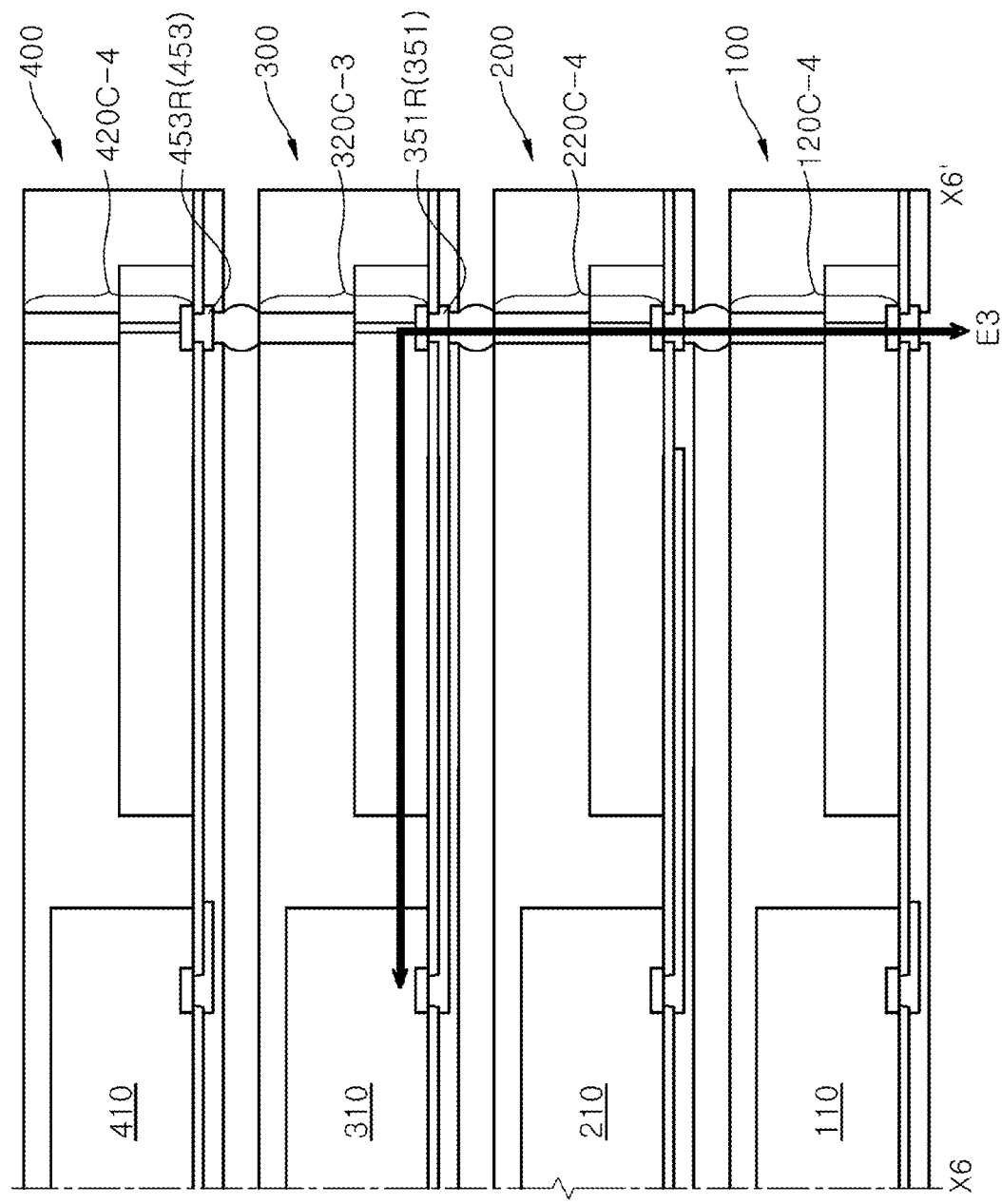
FIG. 12 is a cross-sectional view of a stack package taken along a line X6-X6' of FIG. 11.

FIG. 11 is a schematic view illustrating a third electric path E3 and a third power supply path P3 formed in the third sub-package 300 included in the stack package 10 of FIG. 1. FIG. 12 is a cross-sectional view of the stack package 10, which is taken along a line X6-X6' of FIG. 11, and FIG. 9 is a cross-sectional view of the stack package 10, which is taken along a line X4-X4' of FIG. 8.

Referring to FIGS. 11 and 12, the third sub-package 300 may include third right redistributed lines 351R corresponding to some of the third redistributed lines 351. The third right redistributed lines 351R may electrically connect the third right bridge die 320R to the third semiconductor die 310. The third right redistributed lines 351R may be conductive patterns that extend from the third semiconductor die 310 to the third right bridge die 320R. The third right bridge die 320R may have a configuration similar to the first left bridge die 120L.

The third right redistributed lines 351R may be disposed to provide the third electric path E3 that electrically connects the third right bridge die 320R to the third semiconductor die 310. The third electric path E3 may include signal lines through which signals such as input/output (I/O) data are transmitted. While the third electric path E3 is electrically connected to the third semiconductor die 310, the third electric path E3 may be electrically disconnected and isolated from the first, second and fourth semiconductor dies 110, 210 and 410.

The third right redistributed lines 351R may be conductive patterns that electrically connect the third semiconductor die 310 to third right vertical interconnectors 320C-3 for connection disposed in the third right bridge die 320R. The third right redistributed lines 351R may be electrically disconnected and isolated from the third right vertical interconnectors 320C-4 for bypass, as illustrated in FIG. 11.

Referring to FIG. 12, the second right vertical interconnectors 220C-4 for bypass of the second sub-package 200 may be electrically connected to the third right vertical interconnectors 320C-3 for connection. The first right vertical interconnectors 120C-4 for bypass of the first sub-package 100 may be electrically connected to the second right vertical interconnectors 220C-4 for bypass of the second sub-package 200. Thus, the third electric path E3 may further include the first and second right vertical interconnectors 120C-4 and 220C-4 for bypass which are connected to the third right vertical interconnectors 320C-3 for connection. This third electric path E3 may be electrically isolated from the first and second semiconductor dies 110 and 210.

The third right vertical interconnectors 320C-3 for connection may be electrically connected to the fourth right vertical interconnectors 420C-4 for bypass and the fourth right redistributed pads 453R of the fourth sub-package 400. Since the fourth right vertical interconnectors 420C-4 for bypass and the fourth right redistributed pads 453R are electrically isolated from the fourth semiconductor die 410, the third electric path E3 and the third right vertical interconnectors 320C-3 for connection may be electrically isolated from the fourth semiconductor die 410.

Referring to FIGS. 9 and 11, the third sub-package 300 may include third left redistributed lines 351L corresponding to the others of the third redistributed lines 351. The third left redistributed lines 351L may be conductive patterns that electrically connect the third left bridge die 320L to the third semiconductor die 310. The third left bridge die 320L may have a configuration similar to the first left bridge die 120L which is disposed to vertically overlap with the third left bridge die 320L. The third left redistributed lines 351L may be disposed to provide the third power supply path P3 that electrically connects the third left bridge die 320L to the third semiconductor die 310. The third power supply path P3 may include a power line supplying a power supply voltage to the third semiconductor die 310 and/or a ground line supplying a ground voltage to the third semiconductor die 310. While the third power supply path P3 is electrically connected to the third semiconductor die 310, the third power supply path P3 may be electrically disconnected and isolated from the first and fourth semiconductor die 110 and 410.

The third left redistributed lines 351L may be conductive patterns that electrically connect the third semiconductor die 310 to third left vertical interconnectors 320C-1 for connection disposed in the third left bridge die 320L. The third left redistributed lines 351L may be electrically disconnected and isolated from the third left vertical interconnectors 320C-2 for bypass. The third left redistributed pads 353L may be coupled to the third left vertical interconnectors 320C-2 for bypass. The third left redistributed pads 353L may correspond to the others of the third redistributed pads 353 and may be conductive patterns that are electrically isolated from the third left redistributed lines 351L. Since the third left redistributed pads 353L are electrically isolated from the third semiconductor die 310, the third left vertical interconnectors 320C-2 for bypass bonded to the third left redistributed pads 353L may also be electrically isolated from the third semiconductor die 310.

The second left vertical interconnectors 220C-1 for connection may be additionally connected to the third left vertical interconnectors 320C-1 for connection to connect the third power supply path P3 to the second power supply path P2. Since the third power supply path P3 is electrically connected to the second power supply path P2, a power supply voltage may be applied to both of the second and third semiconductor dies 210 and 310. Since the second power supply path P2 is electrically isolated from the first semiconductor die 110, the third power supply path P3 may also be electrically isolated from the first semiconductor die 110.

The fourth left redistributed pads 453L and the fourth left vertical interconnectors 420C-2 for bypass of the fourth sub-package 400 may be additionally connected to the third left vertical interconnectors 320C-1 for connection. Since the fourth left redistributed pads 453L and the fourth left vertical interconnectors 420C-2 for bypass are electrically isolated from the fourth semiconductor die 410, the third left vertical interconnectors 320C-1 for connection and the second and third power supply paths P2 and P3 may also be electrically isolated from the fourth semiconductor die 410.

Figure 13:
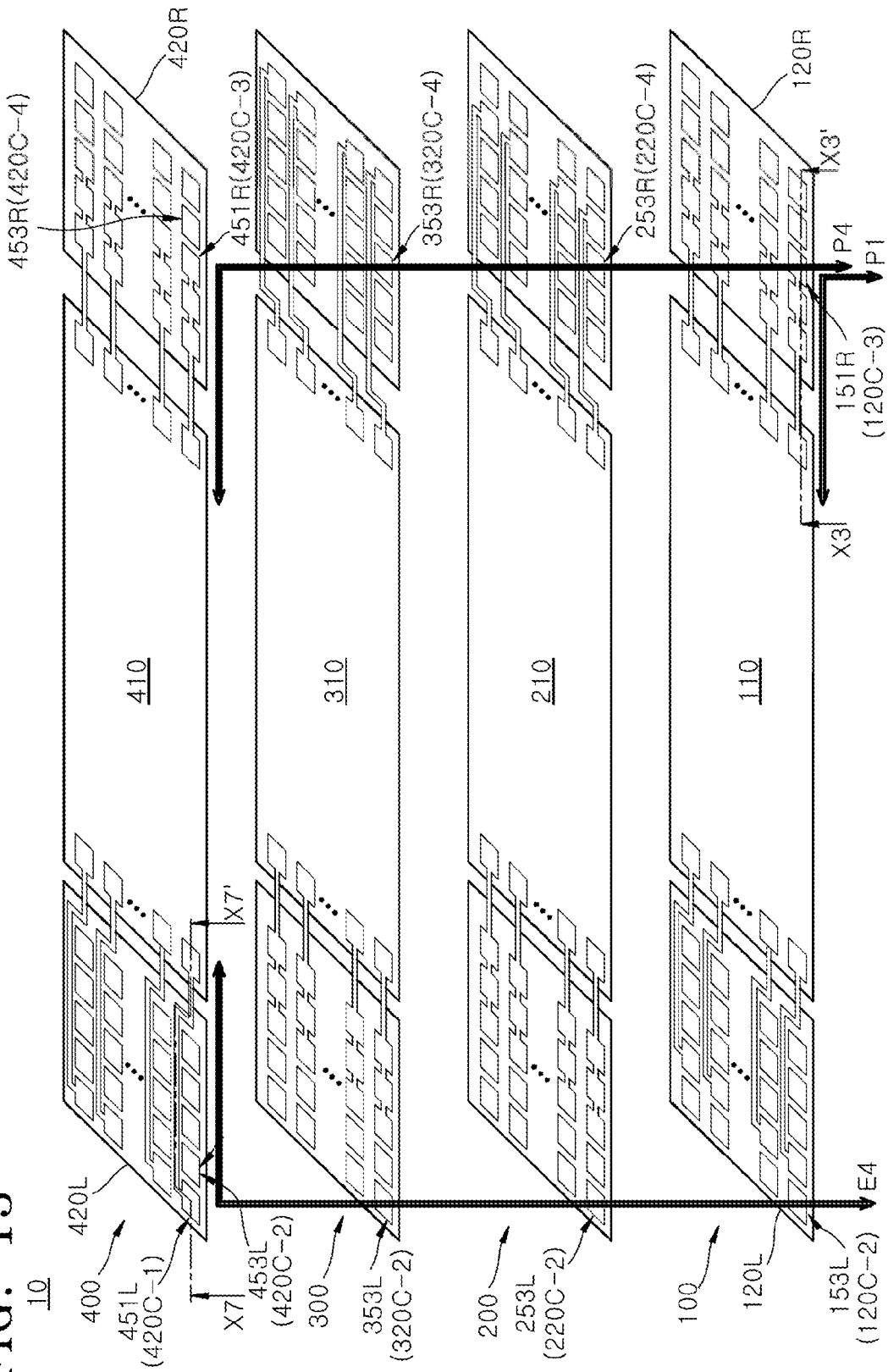
FIG. 13 is a schematic view illustrating a fourth electric path and a fourth power supply path of a fourth sub-package included in the stack package of FIG. 1.
Figure 14:
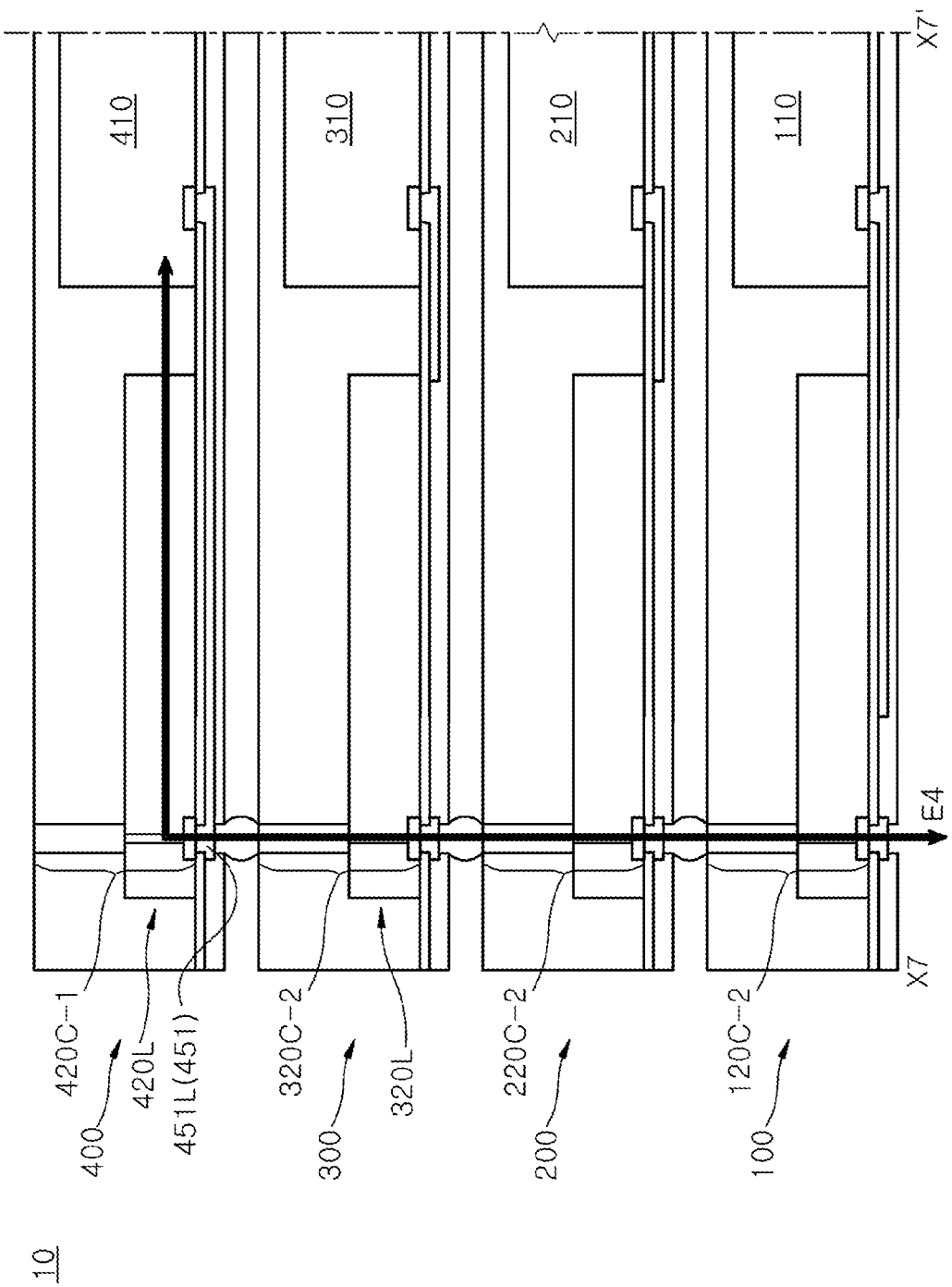
FIG. 14 is a cross-sectional view of a stack package taken along a line X7-X7' of FIG. 13.

FIG. 13 is a schematic view illustrating a fourth electric path E4 and a fourth power supply path P4 formed in the fourth sub-package 400 included in the stack package 10 of FIG. 1. FIG. 14 is a cross-sectional view of the stack package 10, which is taken along a line X7-X7' of FIG. 13, and FIG. 7 is a cross-sectional view of the stack package 10, which is taken along a line X3-X3' of FIGS. 5 and 13.

Referring to FIGS. 13 and 14, the fourth sub-package 400 may include fourth left redistributed lines 451L corresponding to some of the fourth redistributed lines 451. The fourth left redistributed lines 451L may be conductive patterns that electrically connect the fourth left bridge die 420L to the fourth semiconductor die 410. The fourth left bridge die 420L may have a configuration similar to the first left bridge die 120L.

The fourth left redistributed lines 451L may be disposed to provide the fourth electric path E4 that electrically connects the fourth left bridge die 420L to the fourth semiconductor die 410. The fourth electric path E4 may include signal lines through which signals such as input/output (I/O) data are transmitted. While the fourth electric path E4 is electrically connected to the fourth semiconductor die 410, the fourth electric path E4 may be electrically disconnected and isolated from the first, second and third semiconductor dies 110, 210 and 310.

The fourth left redistributed lines 451L may be conductive patterns that electrically connect the fourth semiconductor die 410 to fourth left vertical interconnectors 420C-1 for connection disposed in the fourth left bridge die 420L. The fourth left redistributed lines 451L may be electrically disconnected and isolated from the fourth left vertical interconnectors 420C-2 for bypass and the fourth left redistributed pads 453L, as illustrated in FIG. 13.

In an embodiment that at least one additional sub-package is not stacked on the fourth sub-package 400, the stack package 10 may be designed without the fourth left vertical interconnectors 420C-1 for connection, the fourth left vertical interconnectors 420C-2 for bypass, or the fourth left bridge die 420L.

Referring to FIG. 14, the fourth left vertical interconnectors 420C-1 for connection may be aligned with and connected to the third left vertical interconnectors 320C-2 for bypass of the third sub-package 300. The third left vertical interconnectors 320C-2 for bypass may be aligned with and connected to the second left vertical interconnectors 220C-2 for bypass of the second sub-package 200. The second left vertical interconnectors 220C-2 for bypass may be aligned with and connected to the first left vertical interconnectors 120C-2 for bypass of the first sub-package 100. Thus, the fourth electric path E4 may be configured to further include the first to third left vertical interconnectors 120C-2, 220C-2 and 320C-2 for bypass that are vertically aligned with and connected to the fourth left vertical interconnectors 420C-1 for connection. This fourth electric path E4 may be electrically isolated from the first, second and third semiconductor dies 110, 210 and 310.

Referring to FIGS. 7 and 13, the fourth sub-package 400 may include fourth right redistributed lines 451R corresponding to the others of the fourth redistributed lines 451. The fourth right redistributed lines 451R may be conductive patterns that electrically connect the fourth right bridge die 420R to the fourth semiconductor die 410. The fourth right bridge die 420R may have a configuration similar to the first right bridge die 120R. The fourth right redistributed lines 451R may be disposed to provide the fourth power supply path P4 that electrically connects the fourth right bridge die 420R to the fourth semiconductor die 410. The fourth power supply path P4 may include a power line supplying a power supply voltage to the fourth semiconductor die 410 and/or a ground line supplying a ground voltage to the fourth semiconductor die 410. While the fourth power supply path P4 is electrically connected to the fourth semiconductor die 410, the fourth power supply path P4 may be electrically disconnected and isolated from the second and third semiconductor die 210 and 310.

The fourth right redistributed lines 451R may be conductive patterns that electrically connect the fourth semiconductor die 410 to fourth right vertical interconnectors 420C-3 for connection disposed in the fourth right bridge die 420R. The fourth right redistributed lines 451R may be electrically disconnected and isolated from the fourth right vertical interconnectors 420C-4 for bypass. The fourth right redistributed pads 453R may be coupled to the fourth right vertical interconnectors 420C-4 for bypass. The fourth right redistributed pads 453R may correspond to the others of the fourth redistributed pads 453 and may be conductive patterns that are electrically isolated from the fourth right redistributed lines 451R. Since the fourth right redistributed pads 453R are electrically isolated from the fourth semiconductor die 410, the fourth right vertical interconnectors 420C-4 for bypass bonded to the fourth right redistributed pads 453R may also be electrically isolated from the fourth semiconductor die 410.

In an embodiment that at least one additional sub-package is not stacked on the fourth sub-package 400, the stack package 10 may be designed without the fourth right vertical interconnectors 420C-3 for connection, the fourth right vertical interconnectors 420C-4 for bypass, or the fourth right bridge die 420R.

The fourth right vertical interconnectors 420C-3 for connection may be connected to the third right vertical interconnectors 320C-4 for bypass of the third sub-package 300. The third right vertical interconnectors 320C-4 for bypass may be connected to the second right vertical interconnectors 220C-4 for bypass of the second sub-package 200. The second right vertical interconnectors 220C-4 for bypass may be connected to the first right vertical interconnectors 120C-3 for connection of the first sub-package 100. As such, the fourth power supply path P4 may extend from the fourth right vertical interconnectors 420C-3 for connection to the first right vertical interconnectors 120C-3 for connection to be electrically connected to the first power supply path P1.

Since the fourth power supply path P4 is electrically connected to the first power supply path P1, a power supply voltage may be applied to both of the first and fourth semiconductor dies 110 and 410. Since the fourth power supply path P4 is electrically isolated from the second and third semiconductor dies 210 and 310, the first power supply path P1 may also be electrically isolated from the second and third semiconductor dies 210 and 310.

The first right redistributed lines 151R may electrically connect the first right vertical interconnectors 120C-3 for connection with each other. Thus, the first right vertical interconnectors 120C-3 for connection may have the same electric potential. In addition, the fourth right redistributed lines 451R may electrically connect the fourth right vertical interconnectors 420C-3 for connection with each other. Thus, the fourth power supply path P4 may be configured to include the first right vertical interconnectors 120C-3 for connection, the fourth right vertical interconnectors 420C-3 for connection, and the second and third right vertical interconnectors 220C-4 and 320C-4 for bypass connecting the first right vertical interconnectors 120C-3 for connection to the fourth right vertical interconnectors 420C-3 for connection.

The third right vertical interconnectors 320C-4 for bypass and the second right vertical interconnectors 320C-4 for bypass connected to the third right vertical interconnectors 320C-4 for bypass may constitute an intermediate path, and the intermediate path may electrically connect the fourth power supply path P4 to the first power supply path P1. Since the fourth power supply path P4 is electrically connected to the first power supply path P1 through the intermediate path, a resistance value between the first and second power supply paths P1 and P2 may be reduced by the intermediate path. The intermediate path may be configured to include a plurality of conductive lines that are disposed in parallel to electrically connect the fourth power supply path P4 to the first power supply path P1. Accordingly, the resistance value between the first and second power supply paths P1 and P2 may be significantly reduced.

Referring to FIG. 1, the stack package 10 may include the first to fourth sub-packages 100, 200, 300 and 400 which are vertically stacked. Each of the first to fourth sub-packages 100, 200, 300 and 400 may be configured to include the bridge dies (120L and 120R of FIG. 5, 220L and 220R of FIG. 8, 320L and 320R of FIG. 11, or 420L and 420R of FIG. 13) and the semiconductor die (110, 210, 310 or 410).

As illustrated in FIGS. 5, 6 and 7, the first sub-package 100 may be configured to include the first vertical interconnectors 120C-1 and 120C-3 for connection disposed in the first bridge dies 120L and 120R as well as the first redistributed lines 151L and 151R electrically connecting the first semiconductor die 110 to the first bridge dies 120L and 120R. As illustrated in FIGS. 8, 9 and 10, the second sub-package 200 may be configured to include the second vertical interconnectors 220C-1 and 220C-3 for connection disposed in the second bridge dies 220L and 220R as well as the second redistributed lines 251L and 251R electrically connecting the second semiconductor die 210 to the second bridge dies 220L and 220R.

As illustrated in FIG. 6, the first left vertical interconnectors 120C-1 for connection and the second to fourth left vertical interconnectors 220C-2, 320C-2 and 420C-2 for bypass serially connected to the first left vertical interconnectors 120C-1 for connection may constitute the first electric path E1. As illustrated in FIG. 10, the second right vertical interconnectors 220C-3 for connection as well as the first, third and fourth right vertical interconnectors 120C-4, 320C-4 and 420C-4 for bypass vertically connected to the second right vertical interconnectors 220C-3 for connection may constitute the second electric path E2.

As illustrated in FIGS. 5 and 8, the first and second electric paths E1 and E2 may be electrically isolated from each other to provide two separate electric paths. Similarly, as illustrated in FIGS. 11 and 13, the third and fourth electric paths E3 and E4 may be electrically isolated from each other to provide two separate electric paths.

The first to fourth electric paths E1, E2, E3 and E4 may be connected to respective ones of the first to fourth semiconductor dies 110, 210, 310 and 410. Thus, each of the first to fourth semiconductor dies 110, 210, 310 and 410 may independently receive or output data signals through any one of the first to fourth electric paths E1, E2, E3 and E4 and may independently operate. That is, the first to fourth electric paths E1, E2, E3 and E4 may provide four separate data transmission channels connected to the stack package 10.

In FIG. 2, the second sub-package 200 may be configured to include two semiconductor dies such as the second semiconductor die 210 and the fifth semiconductor die 210-1 as well as four bridge dies such as the second left bridge die 220L, the second right bridge die 220R, the fifth left bridge die 220L-1 and the fifth right bridge die 220R-1. In some embodiments, each of the first, third and fourth sub-packages 100, 300 and 400 may also be configured to include two semiconductor dies and four bridge dies, like the second sub-package 200. In such a case, the stack package 10 may include substantially eight separate electric paths to operate with eight data transmission channels. As such, the stack package may be provided such that each of the first to fourth semiconductor dies 110, 210, 310 and 410 has an independent data transmission channel corresponding to any one of the first to fourth electric paths E1, E2, E3 and E4. Thus, the stack package 10 may function as a high bandwidth device which is capable of operating at a high speed with the increased number of I/O pins.

According to the embodiments described above, each of sub-packages may be configured to include at least one bridge die and at least one semiconductor die, and the sub-packages may be vertically stacked to provide a stack package. Thus, the stack package may have an increased memory capacity, and an operation speed of the stack package may also be improved.

Figure 15:
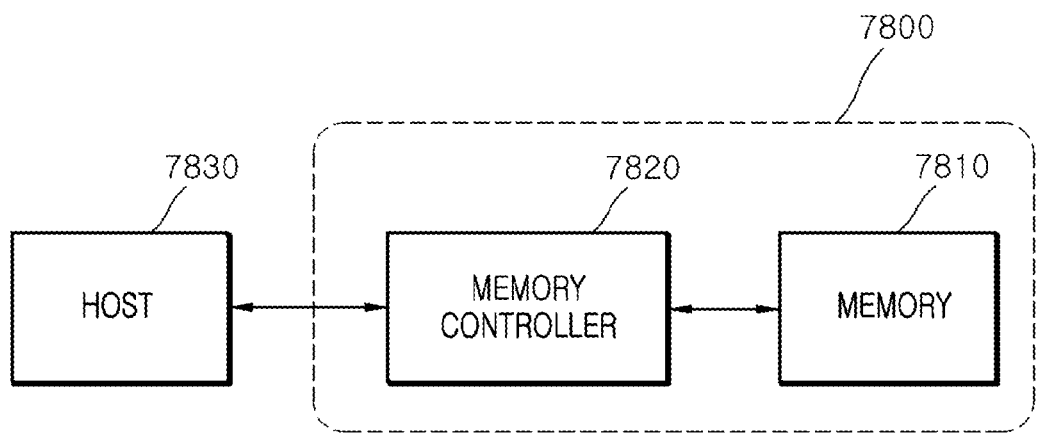
FIG. 15 is a block diagram illustrating an electronic system employing a memory card including a stack package according to an embodiment.

FIG. 15 is a block diagram illustrating an electronic system including a memory card 7800 employing the stack package according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include the stack package according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 16:
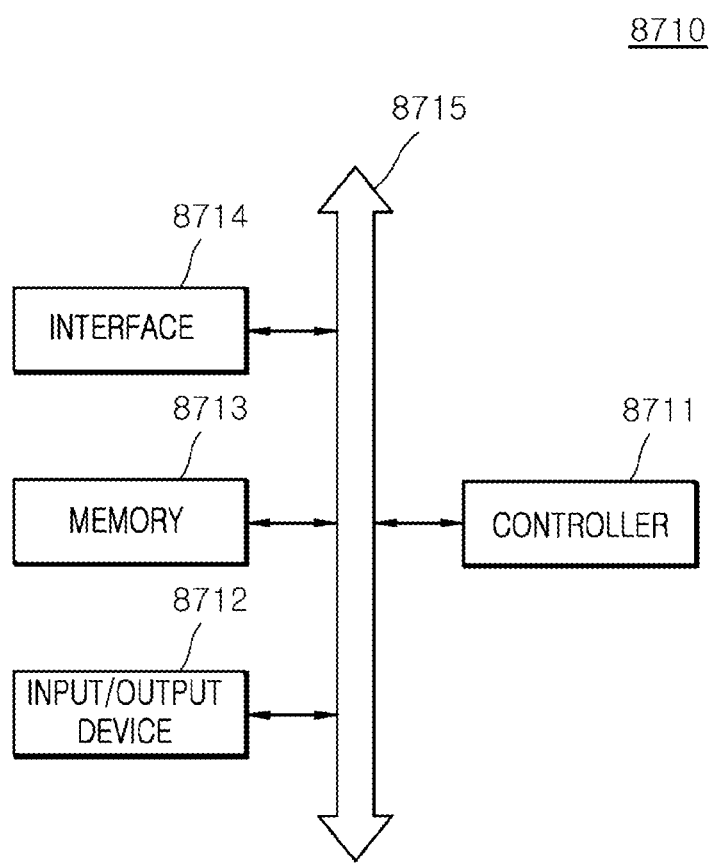
FIG. 16 is a block diagram illustrating an electronic system including a stack package according to an embodiment.

FIG. 16 is a block diagram illustrating an electronic system 8710 including the stack package according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include the stack package according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A stack package comprising:
a first sub-package configured to include a first left bridge die, a first semiconductor die and a first right bridge die which are spaced apart from each other;
a second sub-package stacked on the first sub-package to include a second left bridge die, a second semiconductor die and a second right bridge die which are spaced apart from each other;
a third sub-package stacked on the second sub-package to include a third left bridge die, a third semiconductor die and a third right bridge die which are spaced apart from each other; and
a fourth sub-package stacked on the third sub-package to include a fourth left bridge die, a fourth semiconductor die and a fourth right bridge die which are spaced apart from each other,
wherein the first to fourth left bridge dies includes a first left vertical interconnector for connection and a first left vertical interconnector for bypass, a second left vertical interconnector for connection and a second left vertical interconnector for bypass, a third left vertical interconnector for connection and a third left vertical interconnector for bypass, and a fourth left vertical interconnector for connection and a fourth left vertical interconnector for bypass, respectively,
wherein the first to fourth right bridge dies includes a first right vertical interconnector for connection and a first right vertical interconnector for bypass, a second right vertical interconnector for connection and a second right vertical interconnector for bypass, a third right vertical interconnector for connection and a third right vertical interconnector for bypass, and a fourth right vertical interconnector for connection and a fourth right vertical interconnector for bypass, respectively,
wherein the fourth sub-package further includes a fourth left redistributed line electrically connecting the fourth left vertical interconnector for connection to the fourth semiconductor die,
wherein the third left vertical interconnector for bypass, the second left vertical interconnector for bypass and the first left vertical interconnector for bypass are vertically connected in series to the fourth left vertical interconnector for connection, and
wherein the fourth left vertical interconnector for connection and the first to third left vertical interconnectors for bypass are disposed to electrically bypass the first to third semiconductor dies.

2. The stack package of claim 1,
wherein the third sub-package further includes a third right redistributed line that electrically connects the third right vertical interconnector for connection to the third semiconductor die and electrically bypasses the first, second and fourth semiconductor dies;
wherein the second sub-package further includes a second right redistributed line that electrically connects the second right vertical interconnector for connection to the second semiconductor die and electrically bypasses the first, third and fourth semiconductor dies; and
wherein the first sub-package further includes a first left redistributed line that electrically connects the first left vertical interconnector for connection to the first semiconductor die and electrically bypasses the second, third and fourth semiconductor dies.

3. The stack package of claim 2, wherein the fourth right vertical interconnector for bypass electrically bypassing the fourth semiconductor die, the second right vertical interconnector for bypass electrically bypassing the second semiconductor die, and the first right vertical interconnector for bypass electrically bypassing the first semiconductor die are vertically connected in series to the third right vertical interconnector for connection.

4. The stack package of claim 1,
wherein the fourth sub-package further includes a fourth right redistributed line that electrically connects the fourth right vertical interconnector for connection to the fourth semiconductor die;
wherein the first sub-package further includes a first right redistributed line that electrically connects the first right vertical interconnector for connection to the first semiconductor die;
wherein the third right vertical interconnector for bypass electrically bypassing the third semiconductor die and the second right vertical interconnector for bypass electrically bypassing the second semiconductor die are vertically stacked between the fourth right vertical interconnector for connection and the first right vertical interconnector for connection to electrically connect the fourth right redistributed line to the first right redistributed line.

5. The stack package of claim 4,
wherein the number of the first right vertical interconnector for connection is two or more; and
wherein the first right redistributed line extends to electrically connect the first right vertical interconnectors for connection to each other.

6. The stack package of claim 5, further comprising an outer connector that is electrically connected to the first right redistributed line to apply a power supply voltage to the stack package.

7. The stack package of claim 6, wherein the first sub-package further includes an outer redistributed line that is disposed at a different level from the first right redistributed line to electrically connect the first right redistributed line to the outer connector.

8. The stack package of claim 1,
wherein the third sub-package further includes a third left redistributed line that electrically connects the third left vertical interconnector for connection to the third semiconductor die;
wherein the second sub-package further includes a second left redistributed line that electrically connects the second left vertical interconnector for connection to the second semiconductor die;
wherein the second left vertical interconnector for connection is vertically connected to the third left vertical interconnector for connection; and
wherein the fourth left vertical interconnector for bypass electrically bypassing the fourth semiconductor die and the first left vertical interconnector for bypass electrically bypassing the first semiconductor die are vertically connected to the third left vertical interconnector for connection and the second left vertical interconnector for connection, respectively.

9. The stack package of claim 1, wherein the first left vertical interconnector for connection includes:
a through via vertically penetrating a first left body corresponding to a body of the first left bridge die; and
a post bump connected to the through via and disposed to protrude from a top surface of the first left body.

10. The stack package of claim 9, wherein the first left body has a thickness which is less than a thickness of the first semiconductor die.

11. The stack package of claim 9,
wherein the first sub-package further includes a first redistribution structure of which the first left body and first semiconductor die are disposed on, and
wherein a top surface of the first semiconductor die is further from the first redistribution structure than the top surface of the first left body is from the first redistribution structure.

12. The stack package of claim 9, wherein a portion of a side surface of the post bump faces a side surface of the first semiconductor die.

13. The stack package of claim 9, wherein the post bump has a diameter which is greater than a diameter of the through via.

14. The stack package of claim 9,
wherein the first sub-package further includes a first inner molding layer covering and protecting the first left bridge die, the first semiconductor die and the first right bridge die; and
wherein the first inner molding layer surrounds a side surface of the post bump and reveals a top surface of the post bump.

15. The stack package of claim 14, wherein the first inner molding layer includes an insulation layer and the first left body includes a semiconductor material.

16. The stack package of claim 14,
wherein the second sub-package further includes a second inner molding layer covering and protecting the second left bridge die, the second semiconductor die and the second right bridge die; and
wherein the first inner molding layer laterally extends to protrude from side surfaces of the second inner molding layer of the second sub-package.

17. The stack package of claim 16, further comprising an outer molding layer that covers the protruded portion of the first inner molding layer and extends to cover the second and third sub-packages.

18. A stack package having a plurality of sub-packages, each sub-package comprising:
a bridge die including a plurality of vertical interconnectors; and
a semiconductor die disposed to be spaced apart from the bridge die,
wherein the plurality of sub-packages are vertically stacked to provide a plurality of electric paths comprised of the plurality of vertical interconnectors which are vertically stacked,
wherein a first sub-package of the plurality of sub-packages further includes a first redistributed line that electrically connects a first semiconductor die corresponding to the semiconductor die included to the first sub-package with first vertical interconnectors corresponding to the vertical interconnectors disposed in a first bridge die corresponding to the bridge die included in the first sub-package,
wherein a second sub-package of the plurality of sub-packages further includes a second redistributed line that electrically connects a second semiconductor die corresponding to the semiconductor die included to the second sub-package with second vertical interconnectors corresponding to the vertical interconnectors disposed in a second bridge die corresponding to the bridge die included in the second sub-package,
wherein a first electric path and a second electric path of the electric paths are electrically isolated from each other to provide two separate electric paths,
wherein the first electric path includes a first group of vertical interconnectors, which are vertically connected to the first vertical interconnectors, among the vertical interconnectors,
wherein the second electric path includes a second group of vertical interconnectors, which are vertically connected to the second vertical interconnectors, among the vertical interconnectors, and
wherein the first electric path electrically bypasses the second semiconductor die and the second electric path electrically bypasses the first semiconductor die.

19. A stack package comprising a plurality of sub-packages, wherein each sub-package comprises:
a bridge die disposed on a redistribution structure, wherein the bridge die comprises a first set of vertical interconnectors; and
a semiconductor die disposed on the redistribution structure, wherein the semiconductor die is spaced apart from the bridge die, wherein the plurality of sub-packages is vertically stacked to provide a plurality of electrical pathways, wherein each electrical pathway comprises a second set of vertically stacked interconnectors, wherein, for the each sub-package, the redistribution structure provides an electrical pathway from the first set of vertical interconnectors to the semiconductor die, wherein, for the each sub-package, a vertical interconnector for bypass among the first set of vertical interconnectors is electrically isolated from the semiconductor die, and wherein, for the each sub-package, a vertical interconnector for connection among the first set of vertical interconnectors is electrically connected to the semiconductor die.

* * * * *